(12) United States Patent
Lesso

(10) Patent No.: US 12,053,798 B2
(45) Date of Patent: Aug. 6, 2024

(54) DRIVE CIRCUITRY

(71) Applicant: Cirrus Logic International Semiconductor Ltd., Edinburgh (GB)

(72) Inventor: John Paul Lesso, Edinburgh (GB)

(73) Assignee: Cirrus Logic Inc., Austin, TX (US)

( * ) Notice: Subject to any disclaimer, the term of this patent is extended or adjusted under 35 U.S.C. 154(b) by 825 days.

(21) Appl. No.: 17/102,002

(22) Filed: Nov. 23, 2020

(65) Prior Publication Data

US 2022/0161295 A1 May 26, 2022

(51) Int. Cl.
*B06B 1/02* (2006.01)
*H03K 17/687* (2006.01)
*H10N 30/20* (2023.01)

(52) U.S. Cl.
CPC ....... *B06B 1/0207* (2013.01); *H03K 17/6871* (2013.01); *B06B 2201/55* (2013.01); *H03K 2217/0081* (2013.01); *H10N 30/20* (2023.02)

(58) Field of Classification Search
CPC .................................................. B06B 1/0207
See application file for complete search history.

(56) References Cited

U.S. PATENT DOCUMENTS

| | | | | |
|---|---|---|---|---|
| 2005/0225916 | A1* | 10/2005 | Bolorforosh | B06B 1/0292 361/91.1 |
| 2017/0141603 | A1* | 5/2017 | King | H02M 1/084 |
| 2018/0351478 | A1* | 12/2018 | King | H02N 2/0075 |

FOREIGN PATENT DOCUMENTS

| | | |
|---|---|---|
| CN | 111934580 A | 11/2020 |
| EP | 2254170 A2 | 11/2010 |
| GB | 2484198 A | 4/2012 |

OTHER PUBLICATIONS

International Search Report and Written Opinion of the International Searching Authority, International Application No. PCT/GB2021/052385, mailed Nov. 29, 2021.

* cited by examiner

*Primary Examiner* — Bryan P Gordon
(74) *Attorney, Agent, or Firm* — Jackson Walker L.L.P.

(57) ABSTRACT

Drive circuitry for driving a piezoelectric transducer, the circuitry comprising: an inductor; a first reservoir capacitor; a switch network; and control circuitry configured to control operation of the switch network to selectively couple the inductor to one of a power supply, the first reservoir capacitor and the piezoelectric transducer, wherein the circuitry is operative in a discontinuous mode to transfer charge between the reservoir capacitor and the piezoelectric transducer, and wherein a polarity of the first reservoir capacitor is opposite to a polarity of the power supply.

20 Claims, 26 Drawing Sheets

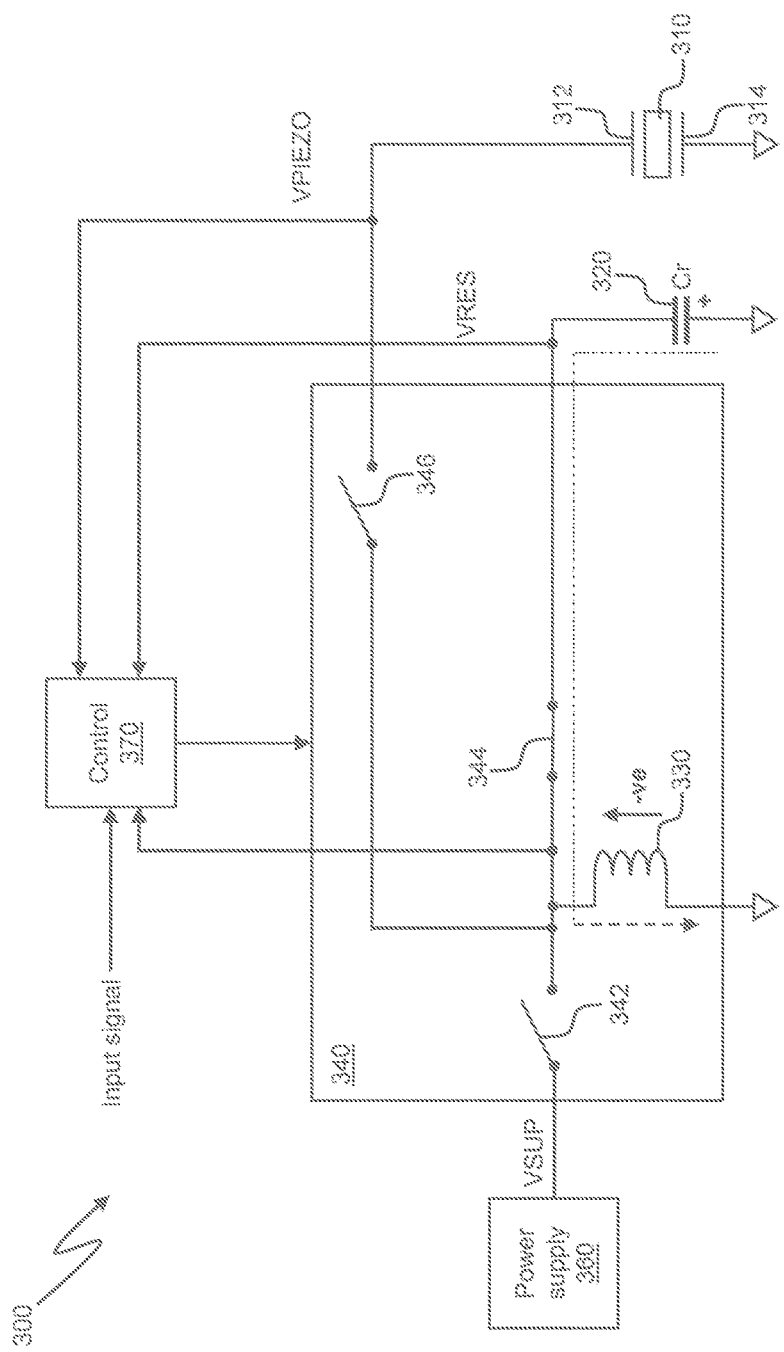

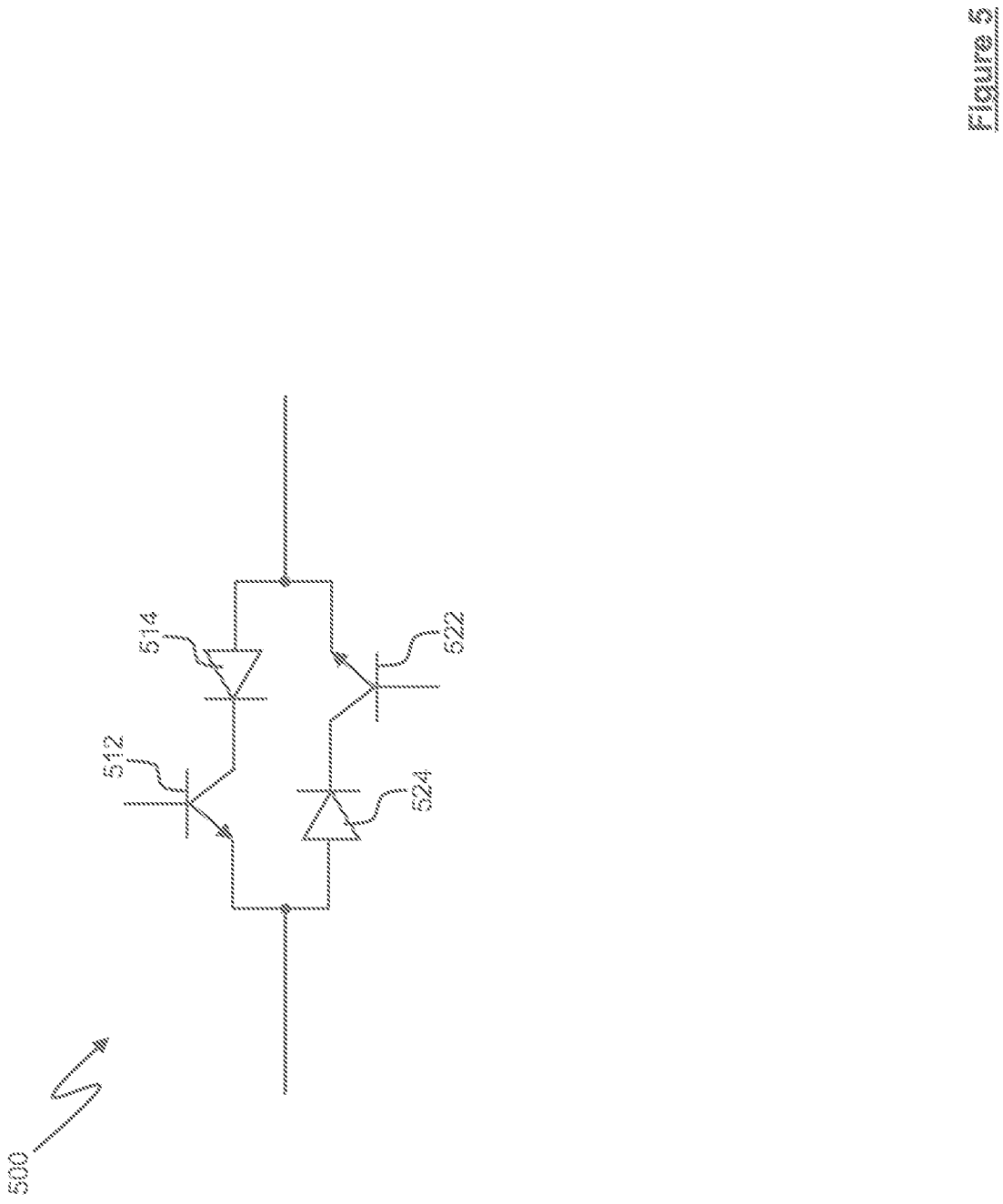

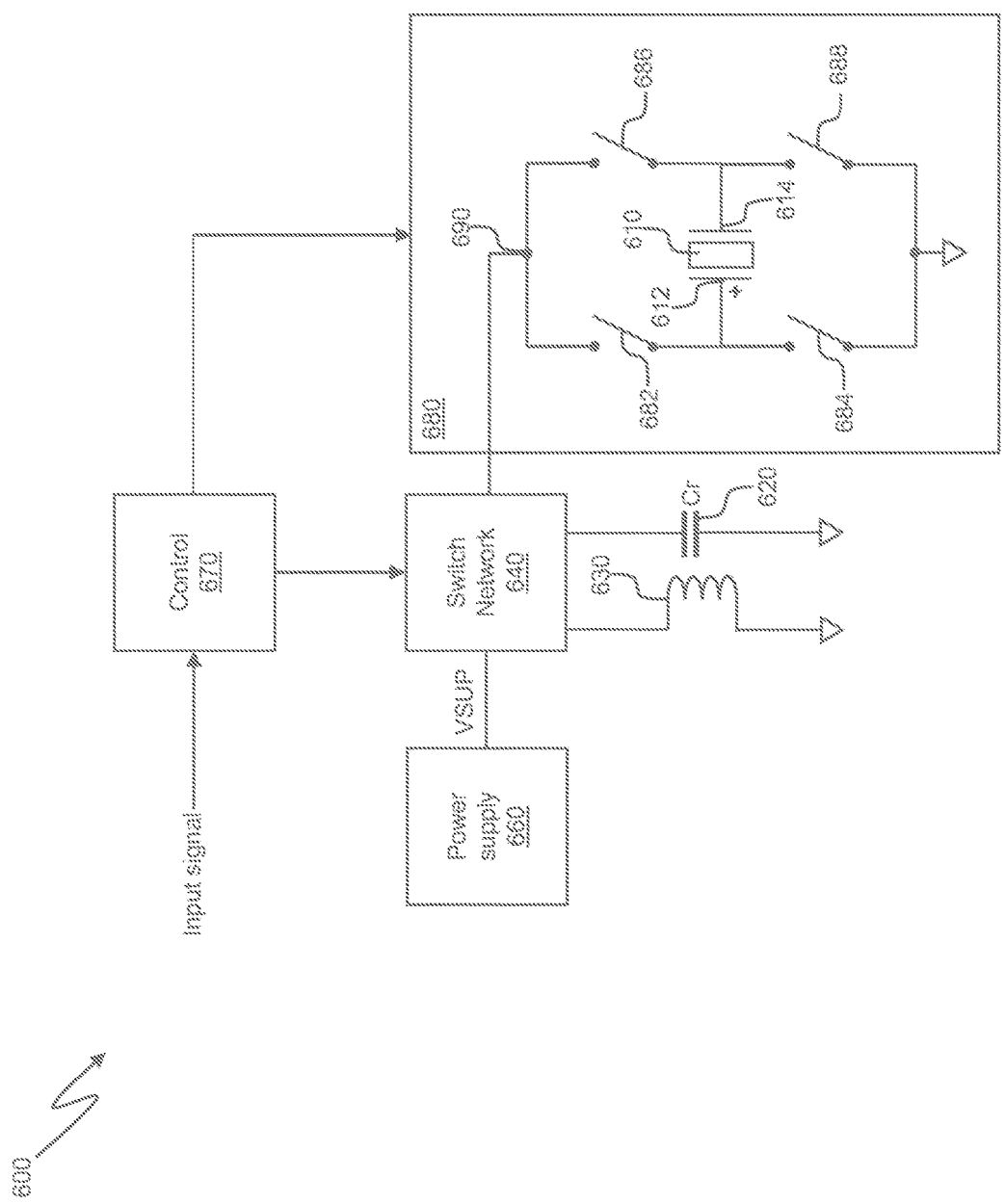

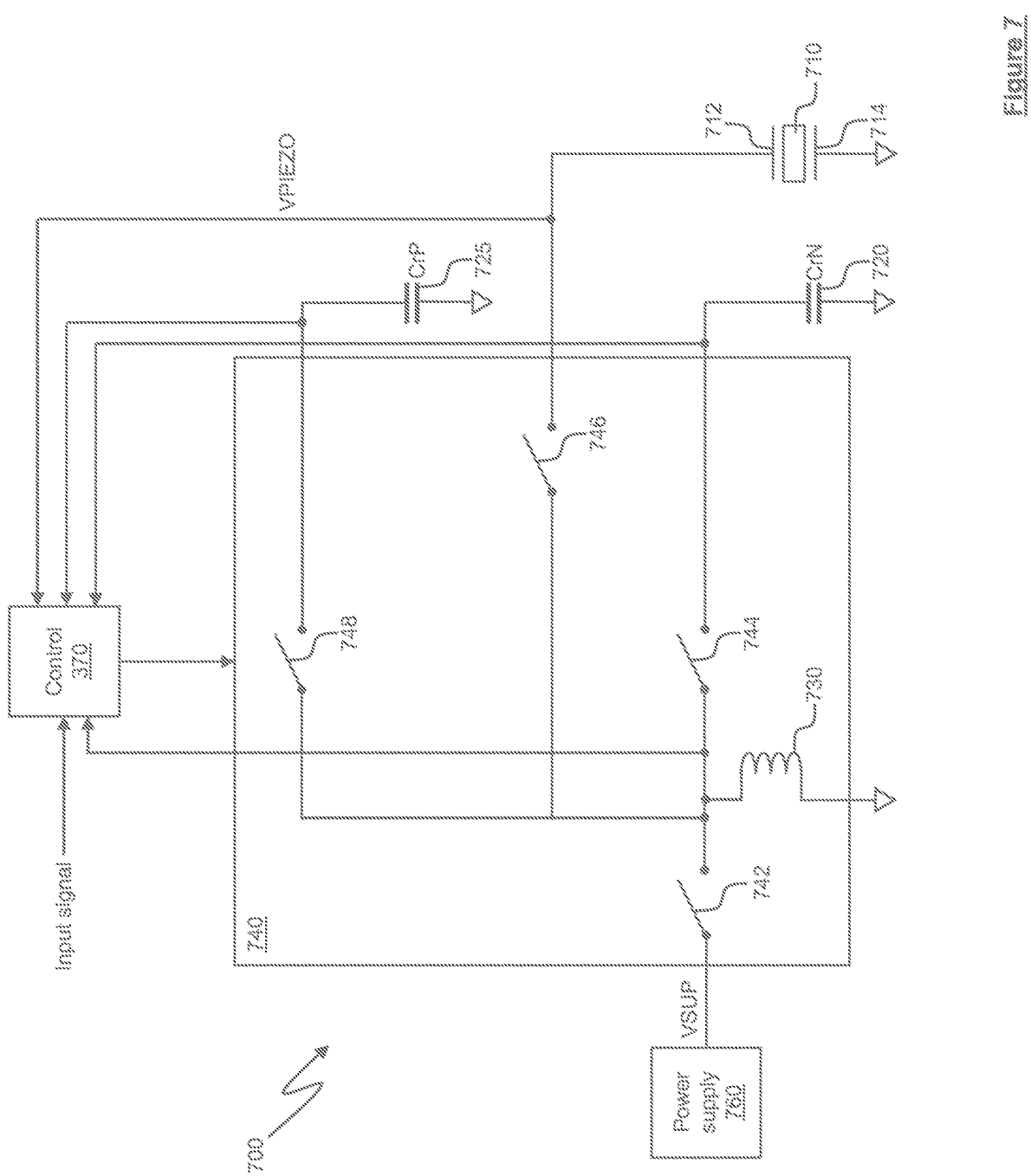

DRIVE CIRCUITRY

FIELD OF THE INVENTION

The present disclosure relates to drive circuitry, and in particular to drive circuitry for piezoelectric transducers or other capacitive loads.

BACKGROUND

Piezoelectric transducers are increasingly being seen as a viable alternative to transducers such as speakers and resonant actuators for providing audio and/or haptic outputs in devices such as mobile telephones, laptop and tablet computers and the like, due to their thin form factor, which may be beneficial in meeting the demand for increasing functionality in such devices without significantly increasing their size. Piezoelectric transducers are also increasingly finding application as transducers for ultrasonic sensing and range-finding systems.

Piezoelectric transducers can be voltage-driven. However, when driven by voltage piezoelectric transducers exhibit both hysteresis and creep, which means that when driven by voltage the displacement of a piezoelectric transducer depends on both the currently-applied voltage and on a previously-applied voltage. Thus, for any given driving voltage there are multiple possible displacements of the piezoelectric transducer. For audio applications this manifests as distortion.

One way of reducing hysteresis and creep and the associated problems in a piezoelectric transducers is to drive the transducer with charge instead of voltage. When driven with charge, the displacement of the piezoelectric transducer varies with the charge applied.

FIG. 1 is a schematic illustration of circuitry for driving a piezoelectric transducer with charge. As shown generally at 100 in FIG. 1, charge drive circuitry 102, which may be charge pump circuitry, for example, may receive an electrical input signal (e.g. an input audio or ultrasonic signal or haptic waveform) from upstream circuitry (not shown) such as amplifier circuitry, and drive a piezoelectric transducer 104 to cause the piezoelectric transducer 104 to produce an audible or haptic output based on the electrical input signal.

SUMMARY

According to a first aspect, the invention provides drive circuitry for driving a piezoelectric transducer, the circuitry comprising:
  an inductor;
  a first reservoir capacitor;
  a switch network; and
  control circuitry configured to control operation of the switch network to selectively couple the inductor to one of a power supply, the first reservoir capacitor and the piezoelectric transducer,
  wherein the circuitry is operative in a discontinuous mode to transfer charge between the reservoir capacitor and the piezoelectric transducer,
  and wherein a polarity of the first reservoir capacitor is opposite to a polarity of the power supply.

The switch network may comprise first, second and third switches.

The first switch may be operative to selectively couple the inductor to a power supply.

The second switch may be operative to selectively couple the inductor to the first reservoir capacitor.

The third switch may be operative to selectively couple the inductor to the piezoelectric transducer.

The control circuitry may be configured to control operation of switch network according to an input signal.

The circuitry may be configured for unipolar drive of the piezoelectric transducer.

Alternatively, the circuitry may be configured for bipolar drive of the piezoelectric transducer.

The circuitry may further comprise commutator circuitry coupled to the switch network, the commutator circuitry being configured to selectively couple a first or a second terminal of the piezoelectric transducer to an output of the switch network.

The circuitry may further comprise a second reservoir capacitor. A polarity of the second reservoir capacitor may be opposite to a polarity of the first reservoir capacitor. The control circuitry may be configured to control operation of the switch network to selectively couple the inductor to one of a power supply, the first reservoir capacitor, the second reservoir capacitor and the piezoelectric transducer.

The switch network may comprises first, second, third and fourth switches.

The first switch may be operative to selectively couple the inductor to a power supply.

The second switch may be operative to selectively couple the inductor to the first reservoir capacitor.

The third switch may be operative to selectively couple the inductor to the piezoelectric transducer.

The fourth switch may be operative to selectively couple the inductor to the second reservoir capacitor.

The inductor may comprises a first terminal and a second terminal. The second terminal may be coupled to a ground or reference voltage supply of the circuitry.

The circuitry may be operative to perform a charging process to charge the first reservoir capacitor.

In a first phase of the charging process, the first switch may couple the inductor to the power supply and the second switch may decouple the inductor from the first reservoir capacitor.

In a second phase of the charging process, the first switch may decouple the inductor from the power supply and the second switch may couple the inductor to the first reservoir capacitor.

The circuitry may be operative to perform a first charge transfer process to transfer charge from the first reservoir capacitor to the piezoelectric transducer.

In a first phase of the first charge transfer process, the second switch may couple the inductor to the first reservoir capacitor and the third switch may decouple the inductor from the piezoelectric transducer.

In a second phase of the first charge transfer process, the second switch may decouple the inductor from the first reservoir capacitor and the third switch may couple the inductor to the piezoelectric transducer.

The circuitry may be operative to perform a second charge transfer process to transfer charge from the piezoelectric transducer to the first reservoir capacitor.

In a first phase of the second charge transfer process, the second switch may decouple the inductor from the first reservoir capacitor and the third switch may couple the inductor to the piezoelectric transducer.

In a second phase of the second charge transfer process, the second switch may couple the inductor to the first reservoir capacitor and the third switch may decouple the inductor from the piezoelectric transducer.

The circuitry may be operative to perform a third charge transfer process to transfer charge from the second reservoir capacitor to the piezoelectric transducer.

In a first phase of the third charge transfer process, the fourth switch may couple the inductor to the second reservoir capacitor and the third switch may decouple the inductor from the piezoelectric transducer.

In a second phase of the third charge transfer process, the fourth switch may decouple the inductor from the second reservoir capacitor and the third switch may couple the inductor to the piezoelectric transducer.

The circuitry may be operative to perform a fourth charge transfer process to transfer charge from the piezoelectric transducer to the second reservoir capacitor.

In a first phase of the fourth charge transfer process, the fourth switch may decouple the inductor from the second reservoir capacitor and the third switch may couple the inductor to the piezoelectric transducer.

In a second phase of the fourth charge transfer process, the fourth switch may couple the inductor to the second reservoir capacitor and the third switch may decouple the inductor from the piezoelectric transducer.

The circuitry may be operative to perform a fifth charge transfer process to transfer charge from the first reservoir capacitor to the second reservoir capacitor.

In a first phase of the fifth charge transfer process, the second switch may couple the inductor to the first reservoir capacitor and the fourth switch may decouple the inductor from the second reservoir capacitor.

In a second phase of the fifth charge transfer process, the fourth switch may couple the inductor to the second reservoir capacitor and the second switch may decouple the inductor from the first reservoir capacitor.

The circuitry may be operative to perform a sixth charge transfer process to transfer charge from the second reservoir capacitor to the first reservoir capacitor.

In a first phase of the sixth charge transfer process, the second switch may decouple the inductor from the first reservoir capacitor and the fourth switch may couple the inductor to the second reservoir capacitor.

In a second phase of the sixth charge transfer process, the fourth switch may decouple the inductor from the second reservoir capacitor and the second switch may couple the inductor to the first reservoir capacitor.

According to a second aspect the invention provides circuitry for driving a piezoelectric transducer, the circuitry comprising:
- an inductor having a first terminal and a second terminal, wherein the second terminal is coupled to a ground or reference voltage supply of the circuitry;
- a first reservoir capacitor;
- a switch network; and
- control circuitry configured to control operation of the switch network so as to switch the first terminal of the inductor between the first reservoir capacitor and the piezoelectric transducer, such that a polarity of a voltage across the inductor reverses each time the first terminal of the inductor is switched.

According to a third aspect the invention provides an integrated circuit comprising the circuitry of the first or second aspect.

The inductor is integrated within the integrated circuit.

According to a fourth aspect the invention provides a device comprising the circuitry of the first or second aspect.

The device may comprise, for example, a mobile telephone, a tablet or laptop computer, a gaming device, an accessory device, a headset, headphones, earphones, or a smart speaker.

BRIEF DESCRIPTION OF THE DRAWINGS

Embodiments of the invention will now be described, strictly by way of example only, with reference to the accompanying drawings, of which:

FIGS. 4a-4f illustrate the operation of the circuitry of FIG. 3;

FIG. 5 is a schematic diagram illustrating a switching arrangement for permitting bidirectional current flow;

FIG. 6 is a schematic diagram illustrating circuitry for enabling bipolar drive of a piezoelectric transducer;

FIG. 7 is a schematic diagram illustrating alternative circuitry for enabling bipolar drive of a piezoelectric transducer.

DETAILED DESCRIPTION

Figure 1:
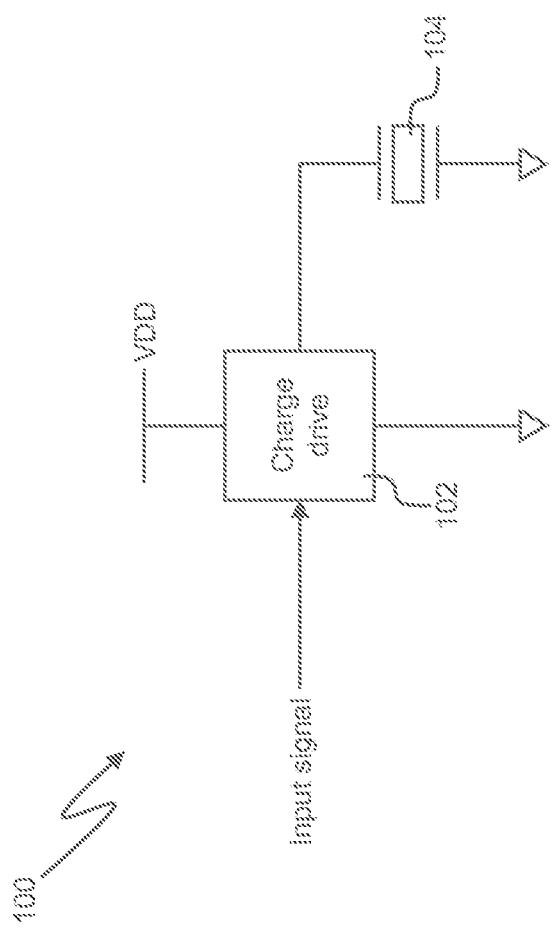
FIG. 1 is a schematic diagram illustrating the concept of driving a piezoelectric transducer with charge.
Figure 2:
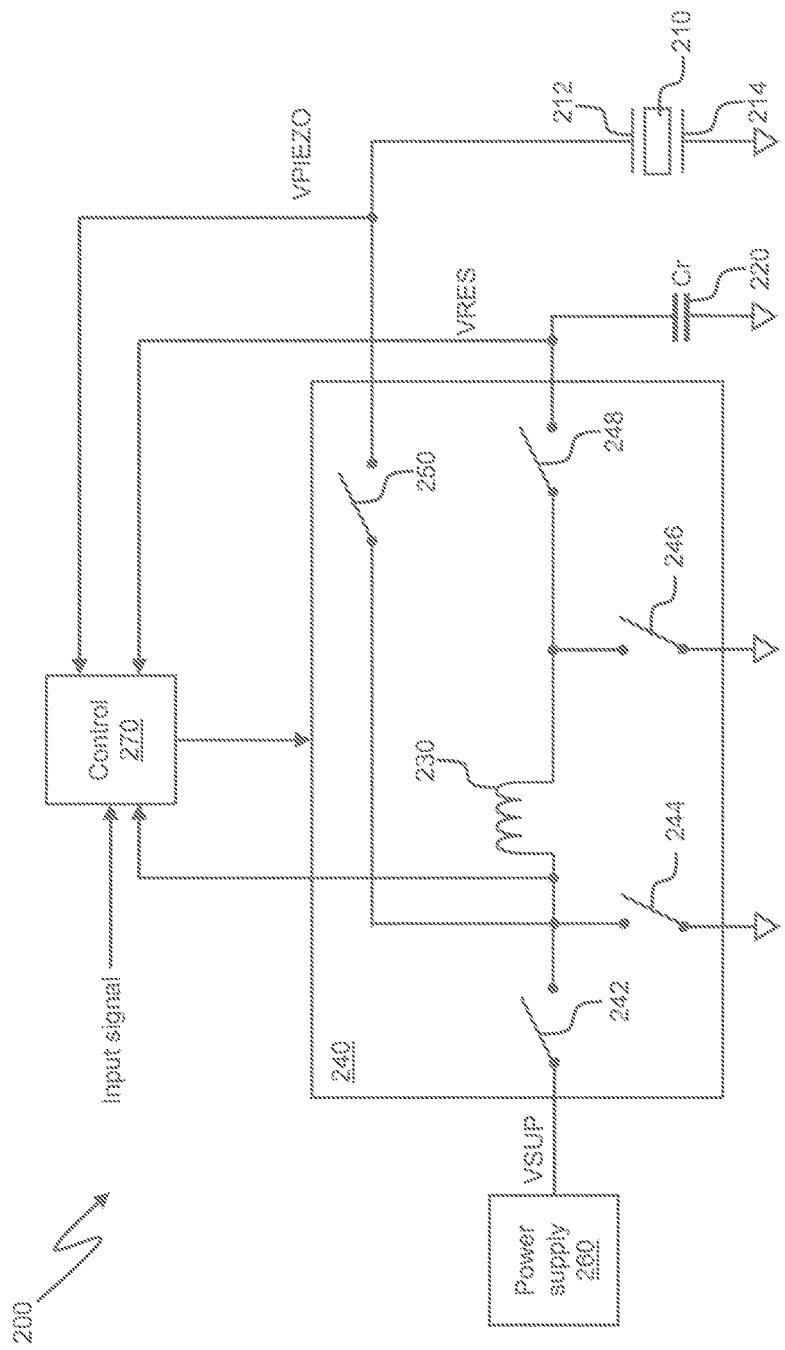
FIG. 2 is a schematic diagram illustrating circuitry for transferring charge between a power supply, a reservoir capacitor and a piezoelectric transducer.

FIG. 2 is a schematic representation of an example system 200 for driving a piezoelectric transducer 210 with charge.

The system 200 includes a reservoir capacitor 220 for storing charge, an inductor 230 and a switch network 240 (in this example comprising first to fifth controllable switches 242-250, which may be, for example, MOSFET devices) for transferring charge between the reservoir capacitor 220 and the piezoelectric transducer 210.

The system 200 also includes a power supply 260 for selectively providing charge to the reservoir capacitor 220. In some examples the power supply 260 may comprise a battery. In other examples the power supply 260 may comprise power supply circuitry that receives power from a power supply such as a battery.

The first switch 242 is coupled between an output of the power supply 260 and a first terminal of the inductor 230.

The second switch 244 is coupled between the first terminal of the inductor 230 and a ground/reference voltage supply rail.

The third switch 246 is coupled between a second terminal of the inductor 230 and the ground/reference voltage supply rail.

The fourth switch 248 is coupled between the second terminal of the inductor 230 and a first terminal of the reservoir capacitor 220. A second terminal of the reservoir capacitor is coupled to the ground/reference voltage supply rail.

The fifth switch 250 is coupled between the first terminal of the inductor 230 and a first terminal 212 of the piezoelectric transducer 210. A second terminal 214 of the piezoelectric transducer 210 is coupled to the ground/reference voltage supply rail.

The system 200 further includes control circuitry 270, operable to control the switches 242-250 to control the transfer of charge between the power supply 260, the reservoir capacitor 220 and the piezoelectric transducer 210, in accordance with an input signal which may be, for example, an audio signal.

On start-up of the system 200 (or a host device incorporating the system 200), charge is transferred from the power supply 260 to the reservoir capacitor 220 to raise a voltage across the reservoir capacitor 220 to a level that is suitable for driving the piezoelectric transducer 210.

In a first phase of a charging process, the first and third switches 242, 246 are closed in response to appropriate control signals transmitted by the control circuitry 270. The control signals are determined based on the amount of charge that needs to be transferred to the piezoelectric transducer 210. This creates a current path through the inductor 230. As current flows through the inductor 230 a magnetic field develops around it, storing energy.

In a second phase of the charging process, the first and third switches 242, 246 are opened and the second and fourth switches 244, 248 are closed, again in response to appropriate control signals transmitted by the control circuitry 270. The magnetic field around the inductor 230 collapses, inducing a current which flows from the inductor 230 to the reservoir capacitor 220, thereby charging the reservoir capacitor 220.

The first and second phases are repeated until the voltage across the reservoir capacitor 220 has increased to a level that is suitable for driving the piezoelectric transducer 210, as determined by the control circuitry 270 based on a feedback signal received from the piezoelectric transducer 210. Once the reservoir capacitor 220 has been charged up to the desired level the first switch 242 is opened, thus decoupling the power supply 260, such that the piezoelectric transducer 210 can be driven by transferring charge from the reservoir capacitor 220.

When the system 200 is required to increase the level of charge on the piezoelectric transducer 210, e.g. to drive the piezoelectric transducer 210 to produce a transducer output, the system 200 again operates in two phases.

In a first phase of the charge transfer process the second and fourth switches 244, 248 are closed, in response to appropriate control signals transmitted by the control circuitry 270. A current path is therefore established from the reservoir capacitor 220 through the inductor 230. As current flows through the inductor 230 a magnetic field develops around it, storing energy.

In a second phase of the charge transfer process, the third and fifth switches 246, 250 are closed, and the second and fourth switches 244, 248 are opened, in response to appropriate control signals transmitted by the control circuitry 270. The magnetic field around the inductor 230 collapses, inducing a current which flows from the inductor 230 to the piezoelectric transducer 210, thereby increasing the charge on the piezoelectric transducer 210.

When the system 200 is required to reduce the level of charge on the piezoelectric transducer 210, charge can be transferred from the piezoelectric transducer 210 to the reservoir capacitor 220, such that the charge remains available for future use, rather than being lost. This improves the efficiency of the system 200.

The process of transferring charge from the piezoelectric transducer 210 to the reservoir capacitor 220 occurs in two phases.

In a first phase the third and fifth switches 246, 250 are closed, in response to appropriate control signals transmitted by the control circuitry 270. A current path is therefore established from the piezoelectric transducer 210 through the inductor 230. As current flows through the inductor 230 a magnetic field develops around it, storing energy.

In a second phase the second and fourth switches 244, 248 are closed, and the third and fifth switches 246, 250 are opened, in response to appropriate control signals transmitted by the control circuitry 270. The magnetic field around the inductor 230 collapses, inducing a current which flows to the reservoir capacitor 220, thus charging the reservoir capacitor 220.

Thus in the system 200 the piezoelectric transducer 210 can be driven by transferring charge to it from the reservoir capacitor 220, and charge can be recycled between the piezoelectric transducer 210 and the reservoir capacitor 220 to improve power efficiency. The power supply 260 provides the initial charge to the reservoir capacitor 220 during the charging process and occasionally or periodically tops up or recharges the reservoir capacitor 220 as necessary.

As will be appreciated from the discussion above, the example system 200 provides a charge recirculating amplifier for driving the piezoelectric transducer 210 with charge. However, the system 200 as illustrated includes a minimum of five switches to implement the switches 242-250, and may in fact require more switches. This is because at least the fourth and fifth switches 248, 250 should be capable of conducting current in two directions and of sustaining a high breakdown voltage, which may necessitate the use of multiple devices (e.g. one switch and an associated diode for each direction of current flow) to implement each of the fourth switch 248 and the fifth switch 250. As will be appreciated by those of ordinary skill in the art, each switch is associated with switching losses, and thus the more switches there are in the system 200 the greater the total switching losses will be in use of the system.

Unipolar drive of a piezoelectric transducer using inverting drive circuitry

Figure 3:
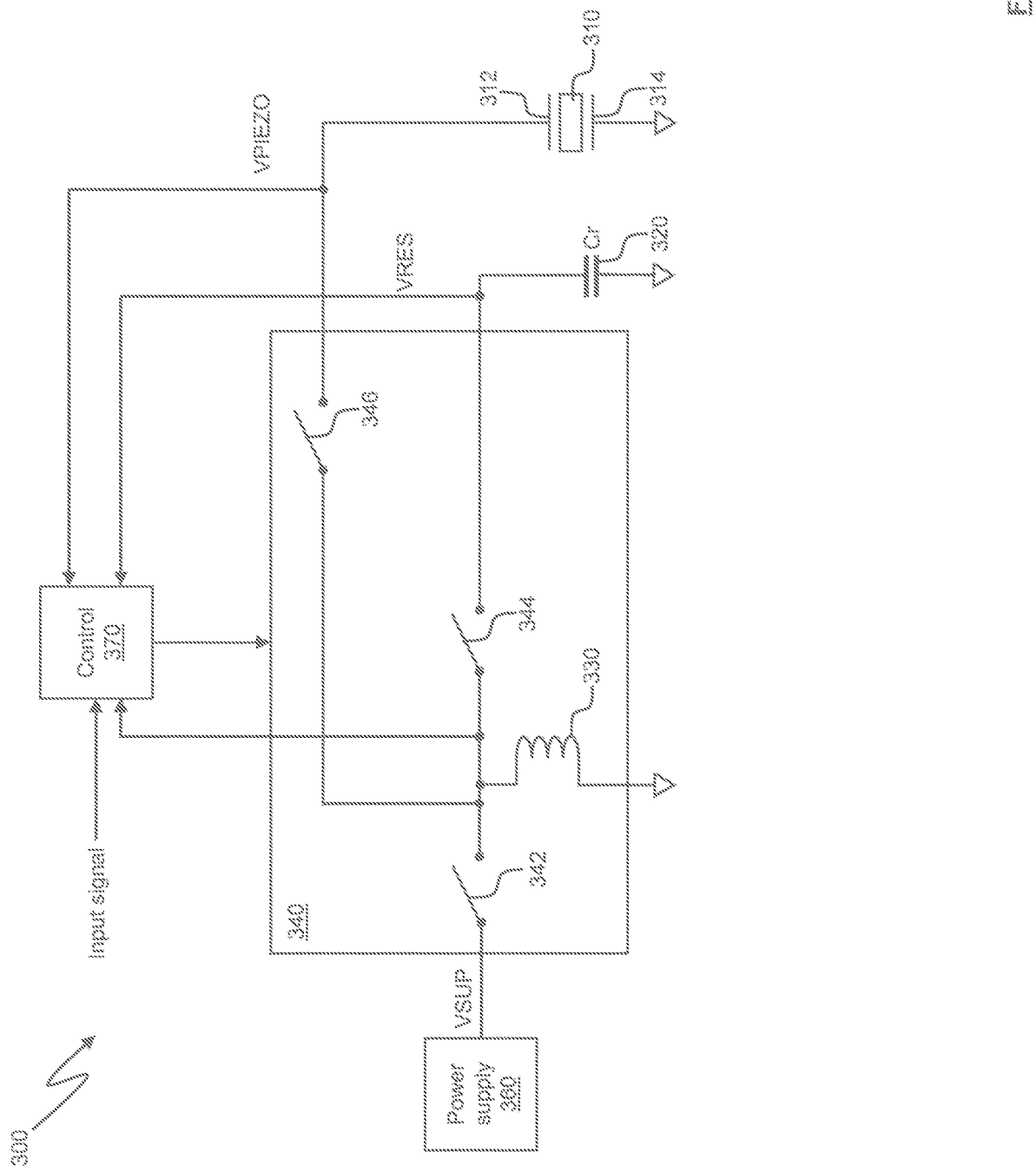
FIG. 3 is a schematic diagram illustrating circuitry for transferring charge between a power supply, a reservoir capacitor and a piezoelectric transducer according to the present disclosure.

FIG. 3 is a schematic representation of an example system 300 for driving a piezoelectric transducer 310 according to the present disclosure.

The system 300 includes a reservoir capacitor 320 for storing charge, an inductor 330 and a switch network 340 including first, second and third switches 342, 344, 346, which may be, for example, MOSFET devices, for transferring charge between the reservoir capacitor 320 and the piezoelectric transducer 310.

The system 300 also includes a power supply 360 for selectively providing charge to the reservoir capacitor 320. In some examples the power supply 360 may comprise a battery. In other examples the power supply 360 may comprise power supply circuitry that receives power from a power supply such as a battery. The polarity of the reservoir capacitor 320 in this example is the opposite of the polarity of the power supply 360. Thus if a positive terminal of the power supply is coupled to the first switch 342, a negative terminal of the reservoir capacitor 320 is coupled to the second switch and a positive terminal of the reservoir capacitor 320 is coupled to ground.

The first switch 342 is coupled between an output of the power supply 360 and a first terminal of the inductor 330. A second terminal of the inductor 330 is coupled to a ground/reference voltage supply rail.

The second switch 344 is coupled between the first terminal of the inductor 330 and a first terminal of the reservoir capacitor 320. A second terminal of the reservoir capacitor 320 is coupled to the ground/reference voltage supply rail.

The third switch 346 is coupled between the first terminal of the inductor 330 and a first terminal 312 of the piezoelectric transducer 310. A second terminal 314 of the piezoelectric transducer is coupled to the ground/reference voltage supply rail.

The system 300 further includes control circuitry 370, operable to control the switches 342-346 to control the transfer of charge between the power supply 360, the reservoir capacitor 320 and the piezoelectric transducer 310, in accordance with a received input signal, which may be, for example, an audio signal.

As will be apparent from FIGS. 2 and 3, the system 300 of FIG. 3 includes fewer switches than the system 200 of FIG. 2, and thus in operation the switching losses associated with the switches 342-346 of the system 300 will be lower than those associated with the switches 240-250 of the system 200.

The operation of the system 300 will now be described with reference to FIGS. 4a-4f.

Charging the Reservoir Capacitor

On start-up of the system 300 (or a host device incorporating the system 300), the reservoir capacitor 320 is initially in a discharged state and no current is flowing through the inductor 330.

Figure 4A:
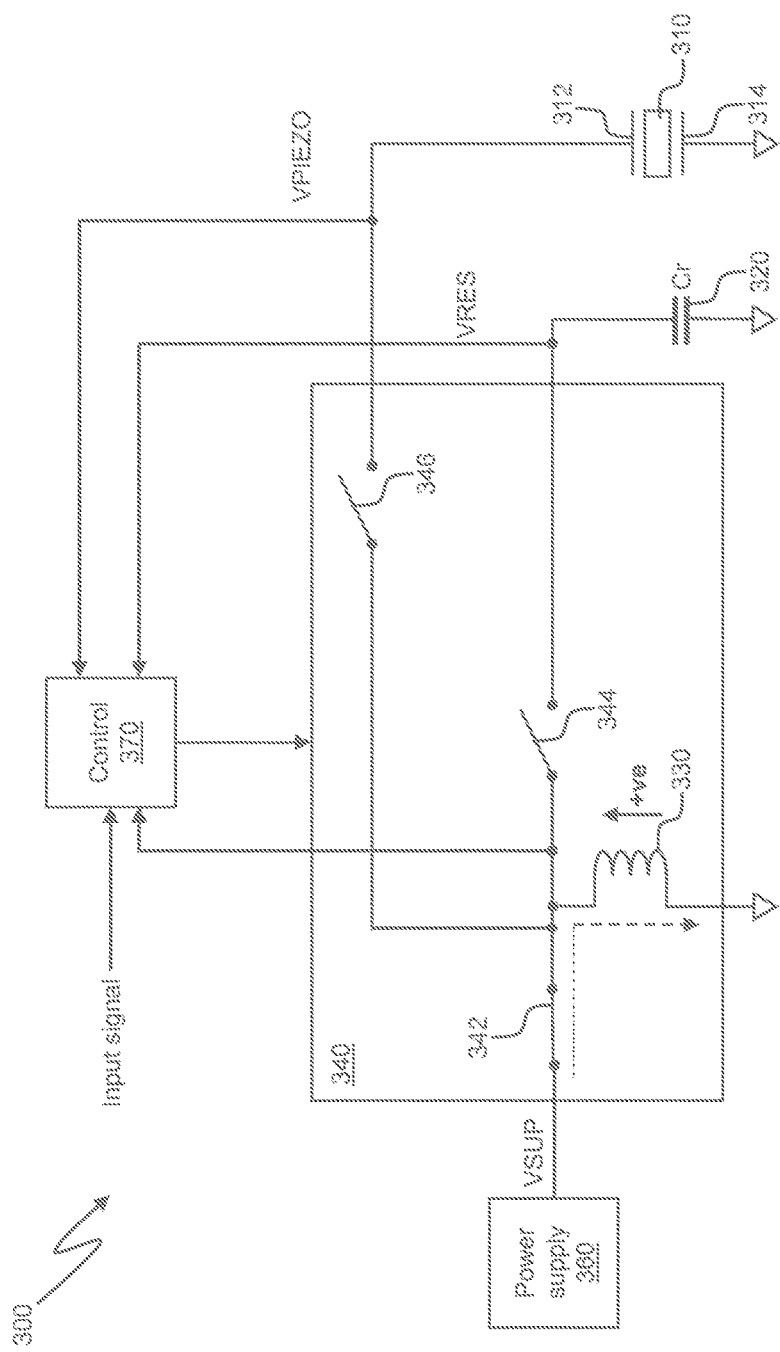

In a first phase of a charging process, illustrated in FIG. 4a, the first switch 342 is closed in response to a control signal transmitted by the control circuitry 370, while the second and third switches 344, 346 remain open. The control signals are determined based on the amount of charge that needs to be transferred to the piezoelectric transducer 310. This couples the power supply 360 to the first terminal of the inductor 330 and thus creates a current path from the power supply 360, through the inductor 330 to the ground/reference voltage supply, as shown by the dashed arrow in FIG. 4a. The current through the inductor 330 increases over time. As the current through the inductor 330 increases, a magnetic field develops around it (as a result of the changing current through the inductor 330), storing energy.

In a second phase of the charging process, illustrated in FIG. 4b, the first switch 342 is opened and the second switch 344 is closed, in response to appropriate control signals transmitted by the control circuitry 370, while the third switch 346 remains closed. This couples the first terminal of the reservoir capacitor 320 to the first terminal of the inductor 330 and thus creates a current path from the reservoir capacitor 320 through the inductor 330 to the ground/reference voltage supply, as shown by the dashed arrow in FIG. 4b.

When the first switch 342 is opened, current stops flowing from the power supply 360 through the inductor 330, and the magnetic field around the inductor 330 collapses. The current through the inductor 330 thus decays, which induces a negative voltage (with respect to the ground or reference voltage) across the inductor 330. Thus when the inductor 330 is switched from the power supply 360 to the reservoir capacitor 320 the polarity of the voltage across the inductor 330 reverses. Because the voltage across the reservoir capacitor 320 is equal to the ground or reference voltage at this time (i.e. Is higher than the induced negative voltage across the inductor 330), current flows from the reservoir capacitor 320 through the inductor 330, and thus a negative voltage develops across the reservoir capacitor 320 and the reservoir capacitor 320 becomes negatively charged.

Once the magnitude of the negative voltage that develops across the reservoir capacitor 320 is equal to the magnitude of the negative voltage across the inductor 330, no current flows from the reservoir capacitor 320 through the inductor 330, and the charging process ends.

Transferring charge from the reservoir capacitor to the piezoelectric transducer When the system 300 is required to increase the level of charge on the piezoelectric transducer 310, e.g. to drive the piezoelectric transducer 310 to produce a transducer output, the system 300 again operates in two phases to perform a charge transfer process.

At the start of the charge transfer process no current flows through the inductor 330 and the reservoir capacitor is negatively charged as described above.

Figure 4C:
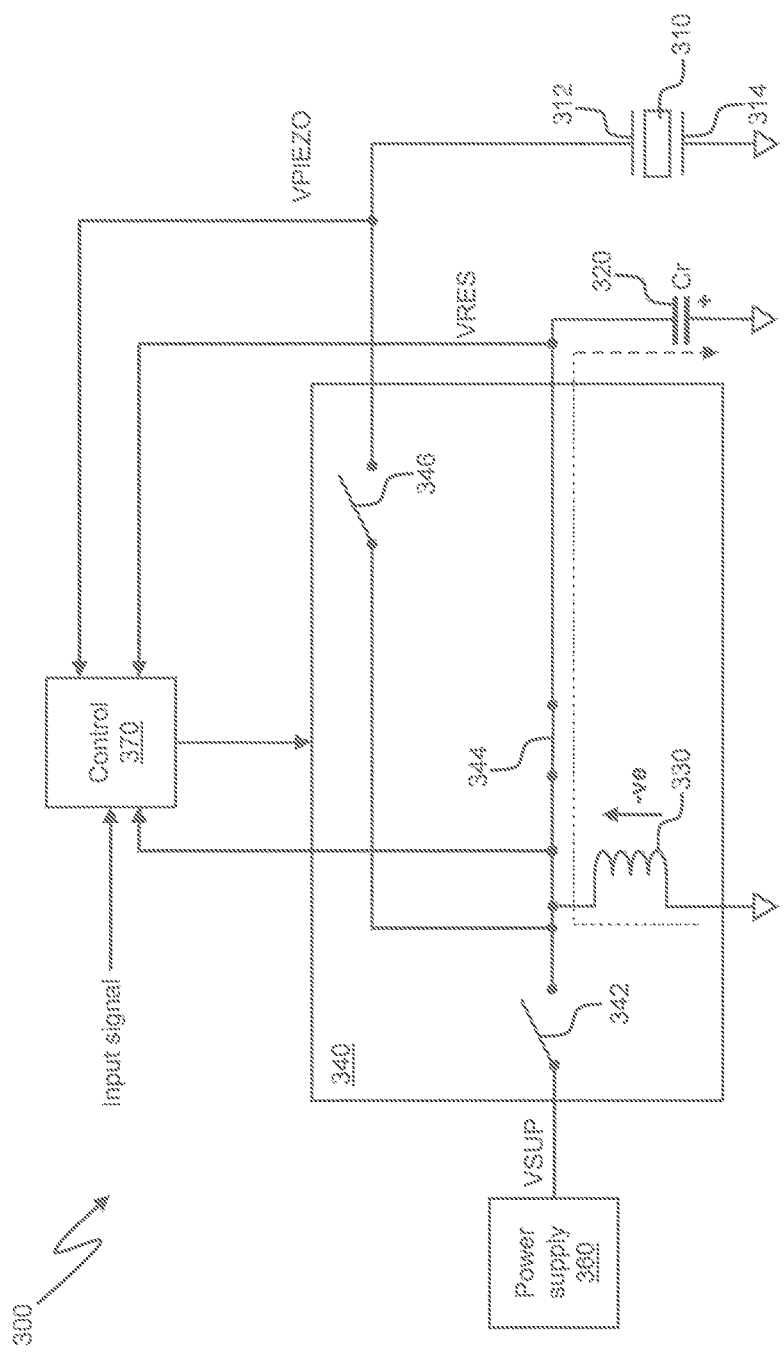

In a first phase of the charge transfer process, illustrated in FIG. 4c, the second switch 344 is closed and the first and third switches 342, 346 are opened, in response to appropriate control signals from the control circuitry 370. This couples the first terminal of the reservoir capacitor 320 to the first terminal of the inductor 330, and thus creates a current path from the inductor 330 to the ground/reference voltage supply through the reservoir capacitor 320, as shown by the dashed arrow in FIG. 4c.

Because the voltage across the reservoir capacitor 320 is negative at this time (and a voltage across the inductor 330 is also negative, due to the coupling between the inductor 330 and the reservoir capacitor 320), current flows from the ground/reference voltage supply through the inductor 330 to the reservoir capacitor 320. A magnetic field develops around the inductor 330 as the current through it increases.

Figure 4D:
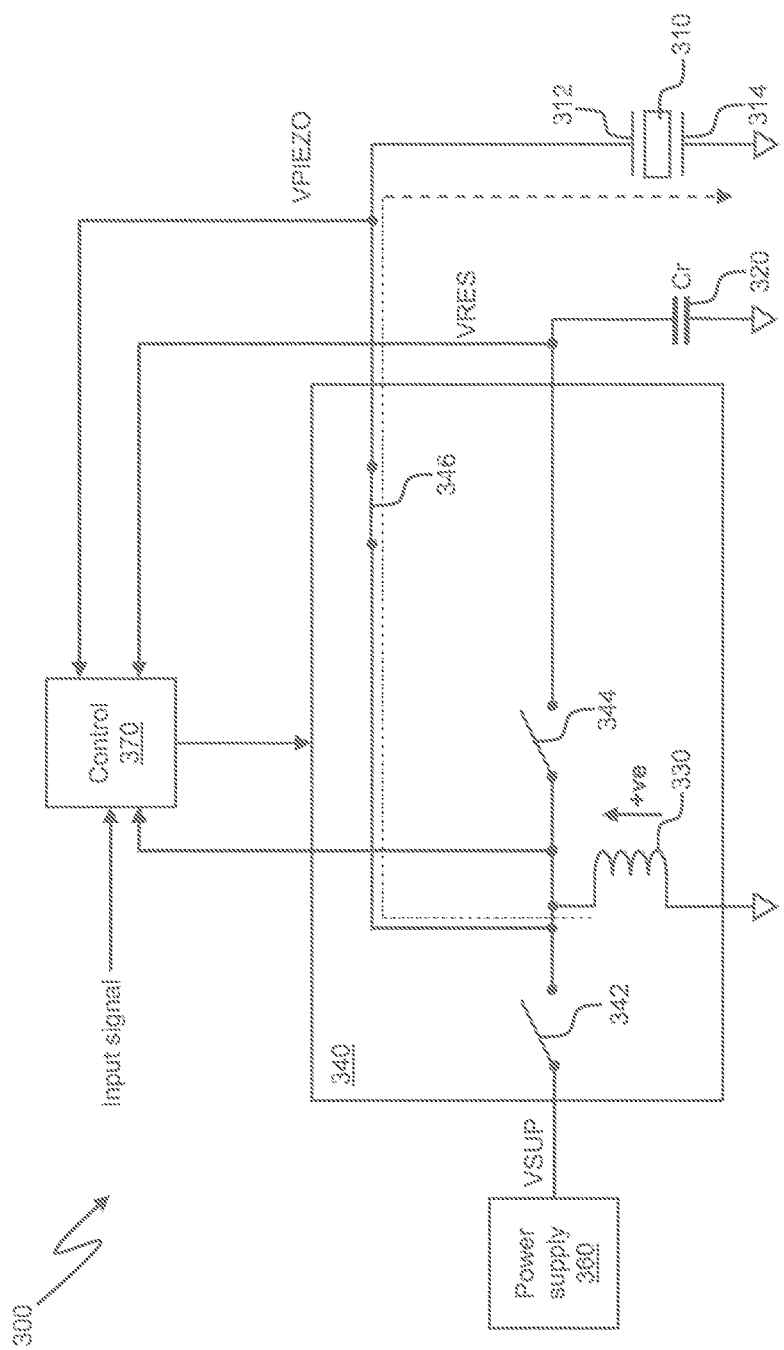

In a second phase of the charge transfer process, illustrated in FIG. 4d, the second switch 344 is opened and the third switch 346 is closed (in response to appropriate control signals from the control circuitry 370), while the first switch 342 remains open. This couples the first terminal of the inductor 330 to the first terminal 312 of the piezoelectric transducer 310 and thus creates a current path from the inductor 330 to the piezoelectric transducer 310, as shown by the dashed arrow in FIG. 4d.

When the second switch 344 is opened, current stops flowing through the inductor 330 to the reservoir capacitor 320, and the magnetic field around the inductor 330 collapses.

The current through the inductor 330 thus decays, which induces a positive voltage (with respect to the ground or reference voltage) across the inductor 330. Thus when the inductor 330 is switched from the reservoir capacitor 320 to the piezoelectric transducer 310, the polarity of the voltage across the inductor 330 reverses. Current therefore flows from the inductor 330 to the piezoelectric transducer 310.

Transferring Charge from the Piezoelectric Transducer to the Reservoir Capacitor When the system 300 is required to reduce the level of charge on the piezoelectric transducer 310, charge can be transferred from the piezoelectric transducer 310 to the reservoir capacitor 320, such that the charge remains available for future use, rather than being lost. This improves the efficiency of the system 300.

The process of transferring charge from the piezoelectric transducer 310 to the reservoir capacitor 320 occurs in two phases.

At the beginning of the process of transferring charge from the piezoelectric transducer 310 to the reservoir capacitor 320, no current flows through the inductance 330.

Figure 4E:
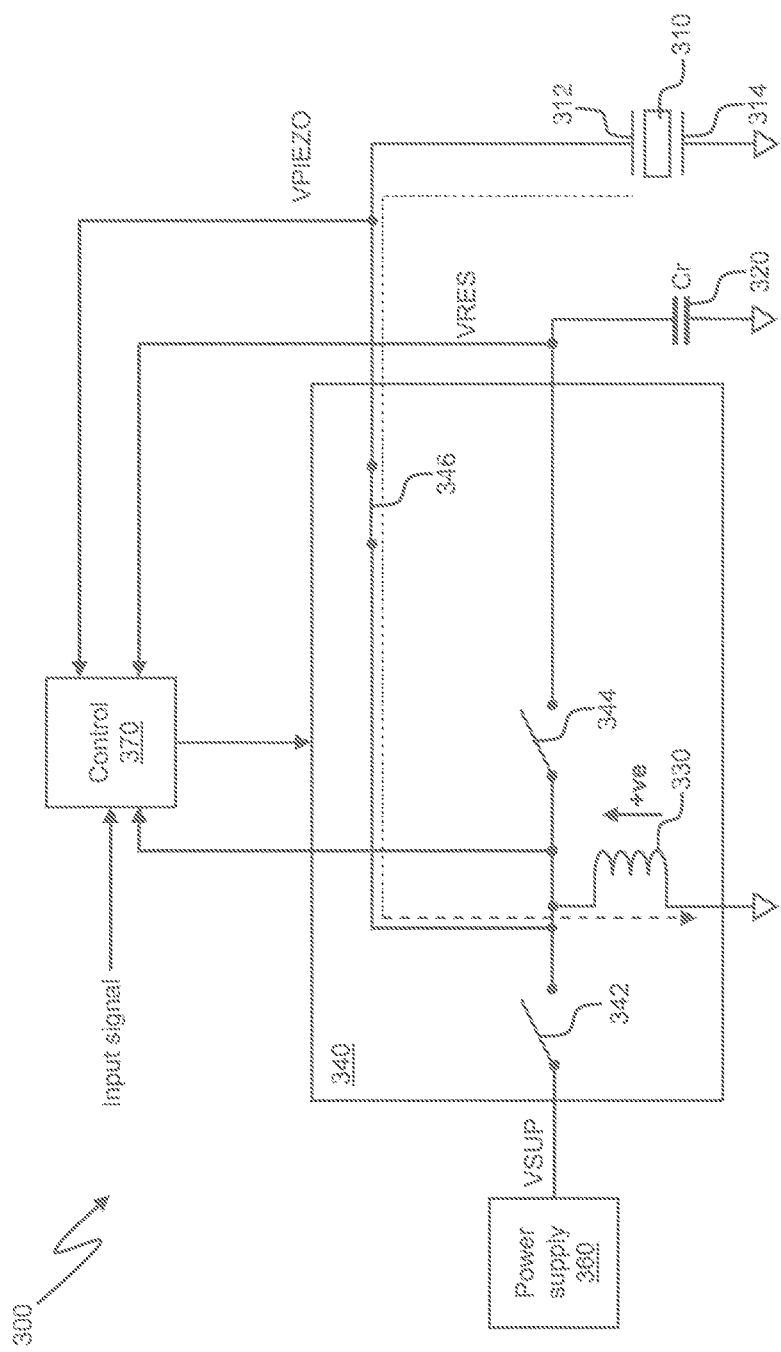

In a first phase of the process, illustrated in FIG. 4e, the third switch 346 is closed and the first and second switches 342, 344 are opened in response to appropriate control signals transmitted by the control circuitry 370. This couples the first terminal 312 of the piezoelectric transducer 310 to the first terminal of the inductor 330. A current path is therefore established from the piezoelectric transducer 310 through the inductor 330 to the ground/reference voltage supply, as indicated by the dashed arrow in FIG. 4e. As current flows through the inductor 330 a magnetic field develops around the inductor 330, storing energy.

Figure 4F:
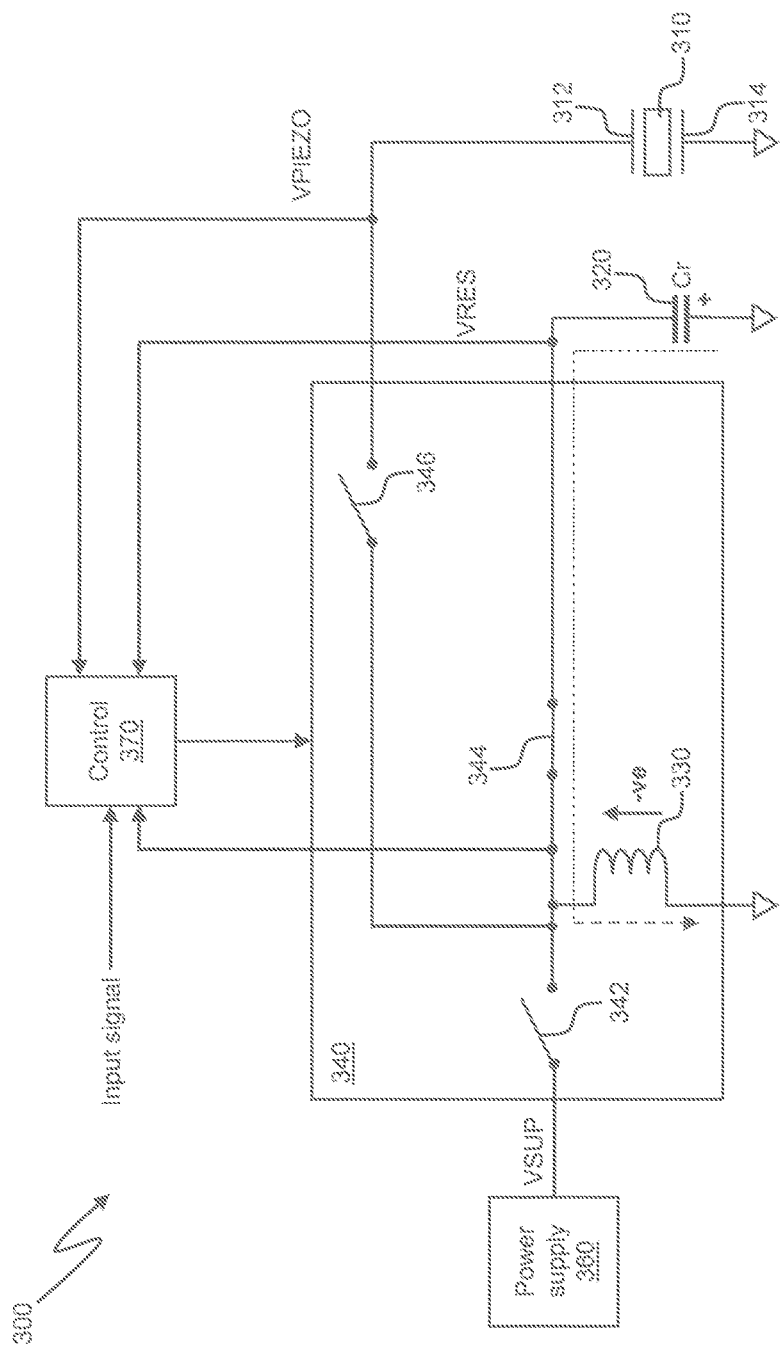

In a second phase, illustrated in FIG. 4f, the third switch 346 is opened and the second switch 344 is closed, in response to appropriate control signals from the control circuitry 370. This couples the first terminal of the inductor 330 to the first terminal of the reservoir capacitor 320 and thus creates a current path from the reservoir capacitor 320, through the inductor 330 to the ground/reference voltage supply, as shown by the dashed arrow in FIG. 4f.

When the third switch 346 is opened, current stops flowing from the piezoelectric transducer 310 through the inductor 330, and the magnetic field around the inductor 330 collapses. The current through the inductor 330 thus decays, which induces a negative voltage (with respect to the ground or reference voltage) across the inductor 330. Thus when the inductor 330 is switched from the piezoelectric transducer 310 to the reservoir capacitor 320, the polarity of the voltage across the inductor 330 reverses. Because the voltage across the reservoir capacitor 320 is equal to the ground or reference voltage at this time, current flows from the reservoir capacitor 320 through the inductor 330, and thus a negative voltage develops across the reservoir capacitor 320 and the reservoir capacitor 320 becomes negatively charged.

Once the magnitude of the negative voltage that develops across the reservoir capacitor 320 is equal to the magnitude of the negative voltage across the inductor 330, no current flows from the reservoir capacitor 320 through the inductor 330, and the charge transfer process from the piezoelectric transducer 310 to the reservoir capacitor 320 ends.

Thus in the system 300 the piezoelectric transducer 310 can be driven by transferring charge to it from the reservoir capacitor 320, and charge can be recycled between the piezoelectric transducer 310 and the reservoir capacitor 320 to improve power efficiency. The power supply 360 provides the initial charge to the reservoir capacitor 320 during the charging process and occasionally or periodically tops up or recharges the reservoir capacitor 320 as necessary.

As will be appreciated from the foregoing description, the current through the inductor at the end of each process (i.e. charging, charge transfer to the piezoelectric transducer 310 and charge transfer from the piezoelectric transducer 310) is zero, and thus the system 300 is configured to operate in a discontinuous mode. Because the polarity of the voltage across the inductor 330 is reversed or inverted when the inductor 330 is switched in each phase (positive-negative over the two phases of the charging process illustrated in FIGS. 4a and 4b, negative-positive over the two phases of the process of transferring charge to the piezoelectric transducer 310 illustrated in FIGS. 4c and 4d, and positive-negative over the two phases of the process of transferring charge from the piezoelectric transducer 310 illustrated in FIGS. 4e and 4f), the system 300 can be said to constitute inverting charge transfer circuitry. Further, as the first terminal 312 of the piezoelectric transducer 310 receives a drive signal of a single polarity (which is positive, in this example), the system 300 can be said to be unipolar. Thus, the system 300 provides unipolar inverting drive circuitry that is operative in a discontinuous mode to transfer charge to the piezoelectric transducer 310.

The system 300, or part of the system 300, may be implemented in integrated circuitry e.g. as a single integrated circuit (IC). Thus in some examples the switch network 340 may be implemented in integrated circuitry, while the inductor 330 and/or the reservoir capacitor 320 may be provided as discrete, off-chip components coupled to the switch network via pins, pads, ball or other connections of the integrated circuitry. In other examples the inductor 330 may be an embedded inductor, integrated within the integrated circuit. The control circuitry 370 may be integrated into the same IC as the switch network 340, or may be provided in or as part of a separate IC.

Alternatively the system may be implemented using discrete circuitry, e.g. as discrete components mounted on a printed circuit board or other suitable substrate.

As will be appreciated by those of ordinary skill in the art, the second and third switches 344, 346 of the system 300 should be capable of conducting current in two opposite directions and of sustaining a high breakdown voltage.

To this end, in a practical implementation of the system 300, each of the second and third switches 344, 346 may be implemented using an arrangement of the kind shown generally at 500 in FIG. 5.

The arrangement 500 comprises a first transistor (e.g. MOSFET device) 512 coupled in series with a first diode 514, and a second transistor (e.g. MOSFET device) 522 coupled in series with a second diode 524, with the series combination of the first transistor 512 and the first diode 514 being coupled in anti-parallel with the series combination of the second transistor 522 and the second diode 524, such that the series combination of the first transistor 512 and the first diode 514 provides a first current path in a first direction and the series combination of the second transistor 522 and the second diode 524 provides a second current path in a second direction, opposite to the first direction.

The system 300 described above with reference to FIGS. 3 and 4a-4f is a unipolar drive system, in the sense that it is always the first terminal 312 of the piezoelectric transducer 310 that is driven.

Bipolar Drive of a Piezoelectric Transducer

It may be advantageous to be able to make the drive bipolar, i.e. drive either of the terminals of the piezoelectric transducer, or drive a single terminal of the piezoelectric transducer with signals of different polarities.

Bipolar Drive Using Commutator Circuitry

Bipolar drive can be achieved by using commutator circuitry coupled to the piezoelectric transducer, as will now be described with reference to FIG. 6, which shows a system 600 for bipolar drive of a piezoelectric transducer 610 according to the present disclosure.

The system 600 includes a reservoir capacitor 620, an inductor 630, a switch network 640, power supply circuitry 660 and control circuitry 670, which may be similar to the corresponding elements of the system 300 of FIG. 3. Thus the structure and operation of the switch network 640, power supply circuitry 660 and control circuitry 670 will not be described here in detail.

The system 600 further includes commutator circuitry 680, which in the illustrated example includes first to fourth controllable switches 682-688. The commutator circuitry 680 is coupled to the control circuitry 670 so as to receive control signals for controlling the operation of the controllable switches 682-688 according to an input signal to the system 600.

The first controllable switch 682 is coupled between a first node 690 of the commutator circuitry 680 and a first terminal 612 of the piezoelectric transducer 610. The first node 690 of the commutator circuitry 680 is coupled to an output of the switch network 640, which is operative to transfer charge between the reservoir capacitor 620 and the piezoelectric transducer 610 as described above with reference to FIGS. 3 and 4a-4f.

The second controllable switch 684 is coupled between the first terminal 612 of the piezoelectric transducer 610 and the ground/reference voltage supply rail.

The third controllable switch 686 is coupled between the first node 690 of the commutator circuitry 680 and a second terminal 614 of the piezoelectric transducer 610.

The fourth controllable switch 688 is coupled between the second terminal 614 of the piezoelectric transducer 610 and the ground/reference voltage supply rail.

By selectively opening and closing the controllable switches 682-688, one of the first and second terminals 612, 614 of the piezoelectric transducer 610 can be coupled to the output of the switch network 640, and the other of the first and second terminals 612, 614 of the piezoelectric transducer 610 can be coupled to the ground/reference voltage supply rail.

For example, when it is desired to transfer charge to or from the first terminal 612 of the piezoelectric transducer 610 (e.g. in response to an input signal to the system 600), the first and fourth switches 682, 688 can be closed and the second and third switches 684, 686 can be opened (in response to appropriate control signals from the control circuitry 670), thus coupling the first terminal 612 of the piezoelectric transducer 610 to the output of the switch network 640, and the second terminal 614 of the piezoelectric transducer to the ground/reference voltage supply rail.

Similarly, when it is desired to transfer charge to or from the second terminal 614 of the piezoelectric transducer 610 (e.g. in response to an input signal to the system 600), the second and third switches 684, 686 can be closed and the first and fourth switches 682, 688 can be opened (in response to appropriate control signals from the control circuitry 670), thus coupling the second terminal 614 of the piezoelectric transducer 610 to the output of the switch network 640, and the first terminal 612 of the piezoelectric transducer to the ground/reference voltage supply rail.

Thus the commutation circuitry 680 enables bipolar drive of the piezoelectric transducer 610.

Bipolar Drive Using First and Second Reservoir Capacitors

Bipolar drive can also be achieved using first and second reservoir capacitors, as will now be described with reference to FIG. 7, which is a schematic representation of an alternative example system 700 for bipolar drive of a piezoelectric transducer 710 according to the present disclosure.

The system 700 includes respective first and second reservoir capacitors 720, 725 for storing charge, an inductor 730, and a switch network 740 comprising first, second, third and fourth switches 742, 744, 746, 748 which may be, for example, MOSFET devices, for transferring charge between the reservoir capacitors 720, 725 and the piezoelectric transducer 710. The first and second reservoir capacitors 720, 725 are of opposite polarities. For example, a first (e.g. positive) terminal of the first reservoir capacitor 720 may be coupled to the ground/reference voltage supply rail, whereas a corresponding first (e.g. positive) terminal of the second reservoir capacitor 725 may be coupled to the first terminal of the inductor 730.

The system 700 also includes a power supply 760 for selectively providing charge to the reservoir capacitors 720, 725. The polarity of the first reservoir capacitor 720 in this example is the opposite of the polarity of the power supply 760. Thus if a positive terminal of the power supply is coupled to the first switch 742, a negative terminal of the first reservoir capacitor 720 is coupled to the second switch and a positive terminal of the first reservoir capacitor 720 is coupled to ground.

In some examples the power supply 760 may comprise a battery. In other examples the power supply 760 may comprise power supply circuitry that receives power from a power supply such as a battery.

The first switch 742 is coupled between an output of the power supply 760 and a first terminal of the inductor 730. A second terminal of the inductor 730 is coupled to a ground/reference voltage supply rail.

The second switch 744 is coupled between the first terminal of the inductor 730 and a first terminal of the first reservoir capacitor 720. A second terminal of the first reservoir capacitor 720 is coupled to the ground/reference voltage supply rail.

The third switch 746 is coupled between the first terminal of the inductor 730 and a first terminal 712 of the piezoelectric transducer 710. A second terminal 714 of the piezoelectric transducer 710 is coupled to the ground/reference voltage supply rail.

The fourth switch 748 is coupled between the first terminal of the inductor 730 and a first terminal of the second reservoir capacitor 725. A second terminal of the second reservoir capacitor 725 is coupled to the ground/reference voltage supply rail.

The system 700 further includes control circuitry 770, operable to control the switches 742-748 to control the transfer of charge between the power supply 760, the reservoir capacitors 720, 725 and the piezoelectric transducer 710, in accordance with an input signal which may be, for example, an audio signal.

As will be apparent from FIGS. 2 and 7, the system 700 of FIG. 7 includes fewer switches than the system 200 of FIG. 2, and thus in operation the switching losses associated with the switches 742-748 of the system 700 will be lower than those associated with the switches 240-250 of the system 200.

The operation of the system 700 will now be described with reference to FIGS. 8*a*-8*n*.

Charging the First Reservoir Capacitor

On start-up of the system 700 (or a host device incorporating the system 700), the first and second reservoir capacitors 720, 725 are initially in a discharged state and no current flows through the inductor 730.

To charge the first reservoir capacitance 720, a two-phase charging process is performed, as will now be described with reference to FIGS. 8*a* and 8*b*.

Figure 8A:
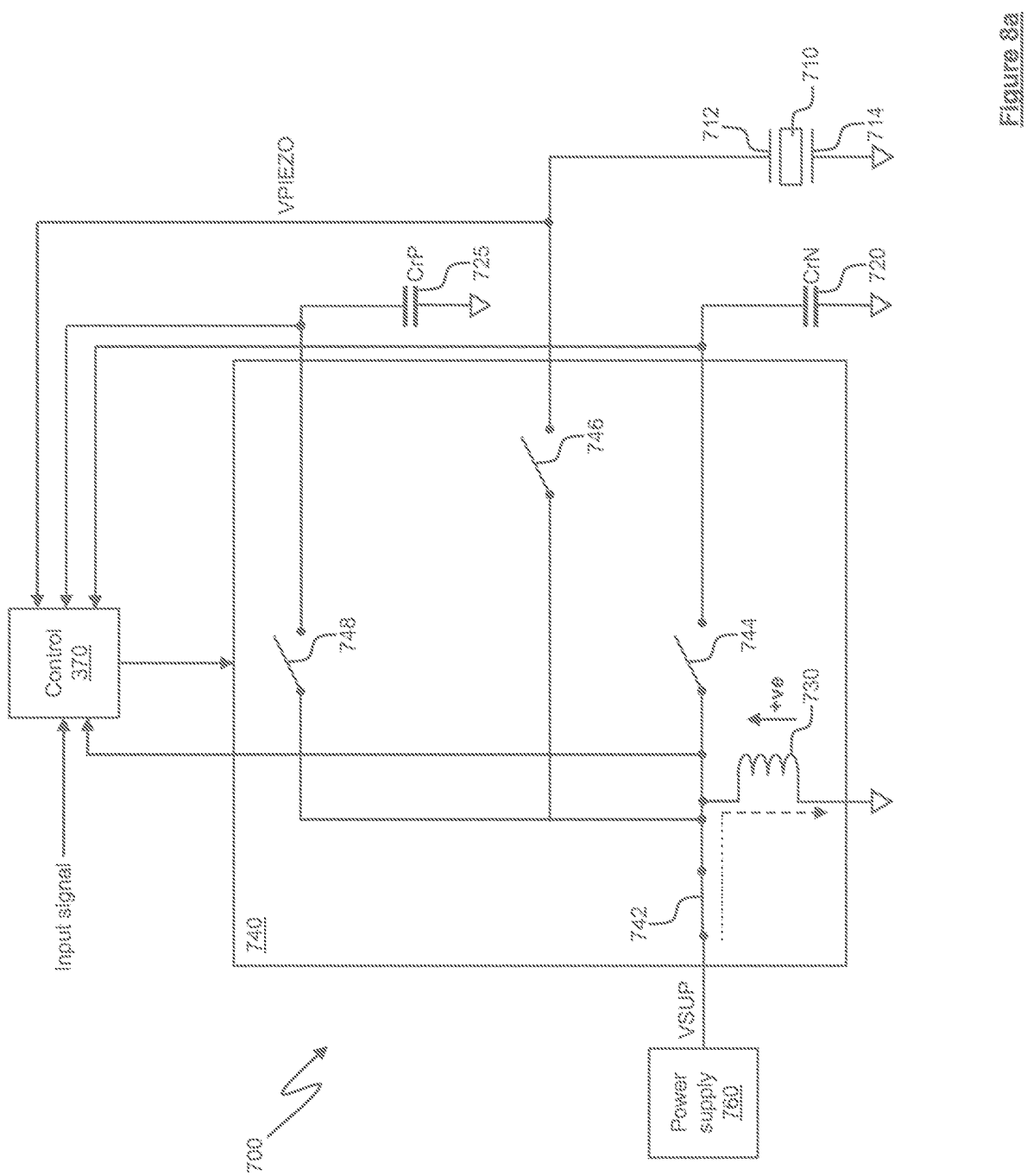
FIGS. 8a-8n illustrate the operation of the circuitry of FIG. 7.

In a first phase of the charging process, illustrated in FIG. 8*a*, the first switch 742 is closed in response to a control signal transmitted by the control circuitry 770, while the second, third and fourth switches 744-748 remain open. The control signals are determined based on the amount of charge that needs to be transferred to the piezoelectric transducer 710. This creates a current path from the power supply 760, through the inductor 730 to the ground/reference voltage supply, as shown by the dashed arrow in FIG. 7*a*. The current through the inductor 730 increases over time. As the current through the inductor 730 increases, a magnetic field develops around it (as a result of the changing current through the inductor 730), storing energy.

In a second phase of the charging process, illustrated in FIG. 8*b*, the first switch 742 is opened and the second switch 744 is closed, in response to appropriate control signals transmitted by the control circuitry 770, while the third and fourth switches 746, 748 remain closed. This creates a current path from the first reservoir capacitor 720, through the inductor 730, to the ground/reference voltage supply, as shown by the dashed arrow in FIG. 8*b*.

When the first switch 742 is opened, current stops flowing from the power supply 760 through the inductor 730, and the magnetic field around the inductor 730 collapses. The current through the inductor 730 thus decays, which induces a negative voltage (with respect to the ground or reference voltage) across the inductor 730. Thus when the inductor 730 is switched from the power supply 760 to the first reservoir capacitor 720, the polarity of the voltage across the inductor 730 reverses. Because the voltage across the first reservoir capacitor 720 is equal to the ground or reference voltage at this time, current flows from the first reservoir capacitor 720 through the inductor 730, and thus a negative voltage develops across the first reservoir capacitor 720 and the first reservoir capacitor 720 becomes negatively charged.

Once the magnitude of the negative voltage that develops across the first reservoir capacitor 720 is equal to the magnitude of the negative voltage across the inductor 730, no current flows from the first reservoir capacitor 720 through the inductor 730, and the charging process ends.

Figure 8D:
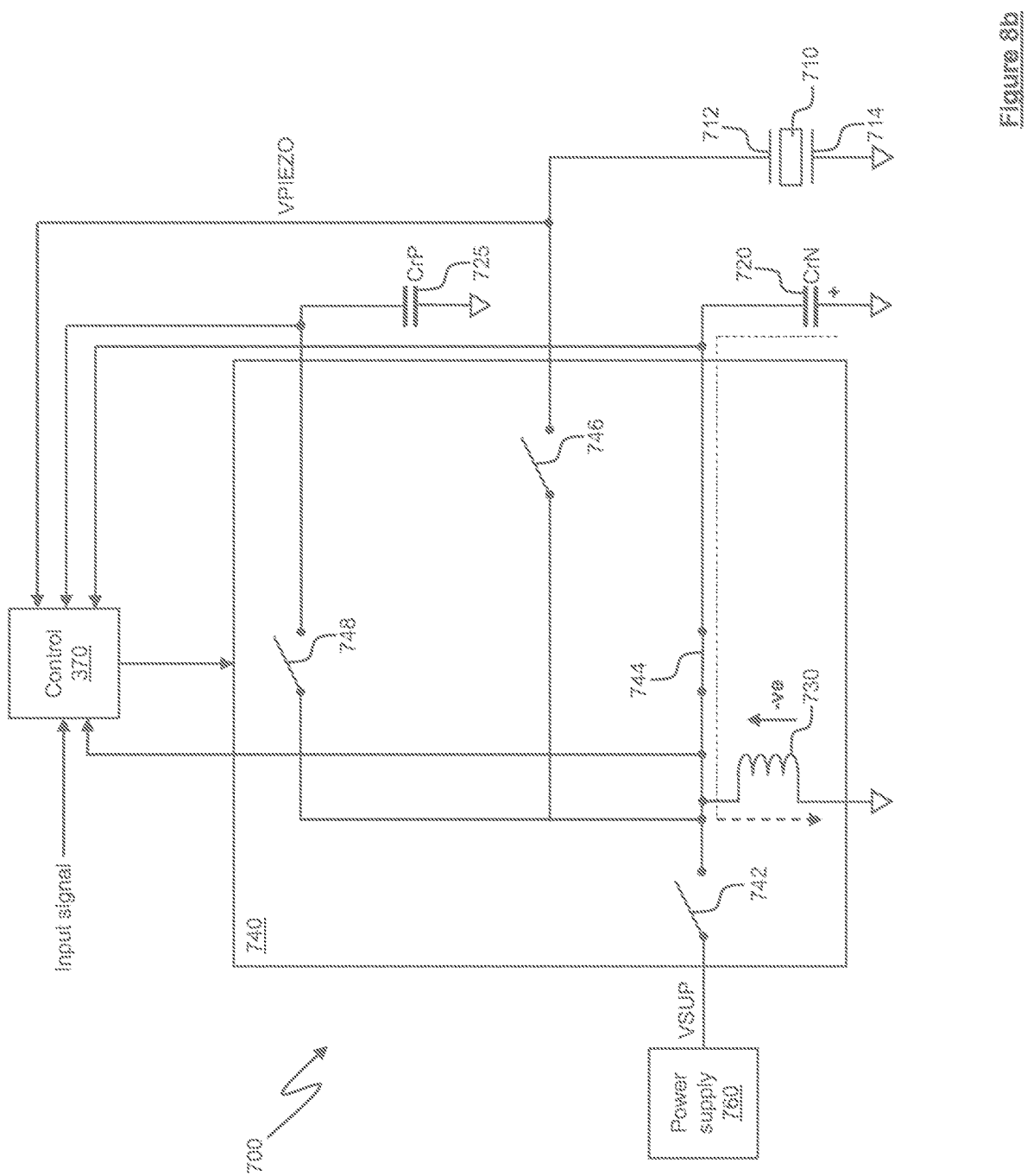

Transferring Charge from the First Reservoir Capacitor to the Second Reservoir Capacitor Charge can be transferred from the first reservoir capacitor 720 to the second reservoir capacitor 725 using a two-phase charge transfer process, as will now be described with reference to FIGS. 8c and 8d.

At the beginning of the charge transfer process no current flows through the inductor 730 and there is a negative voltage across the first reservoir capacitor 720.

Figure 8C:
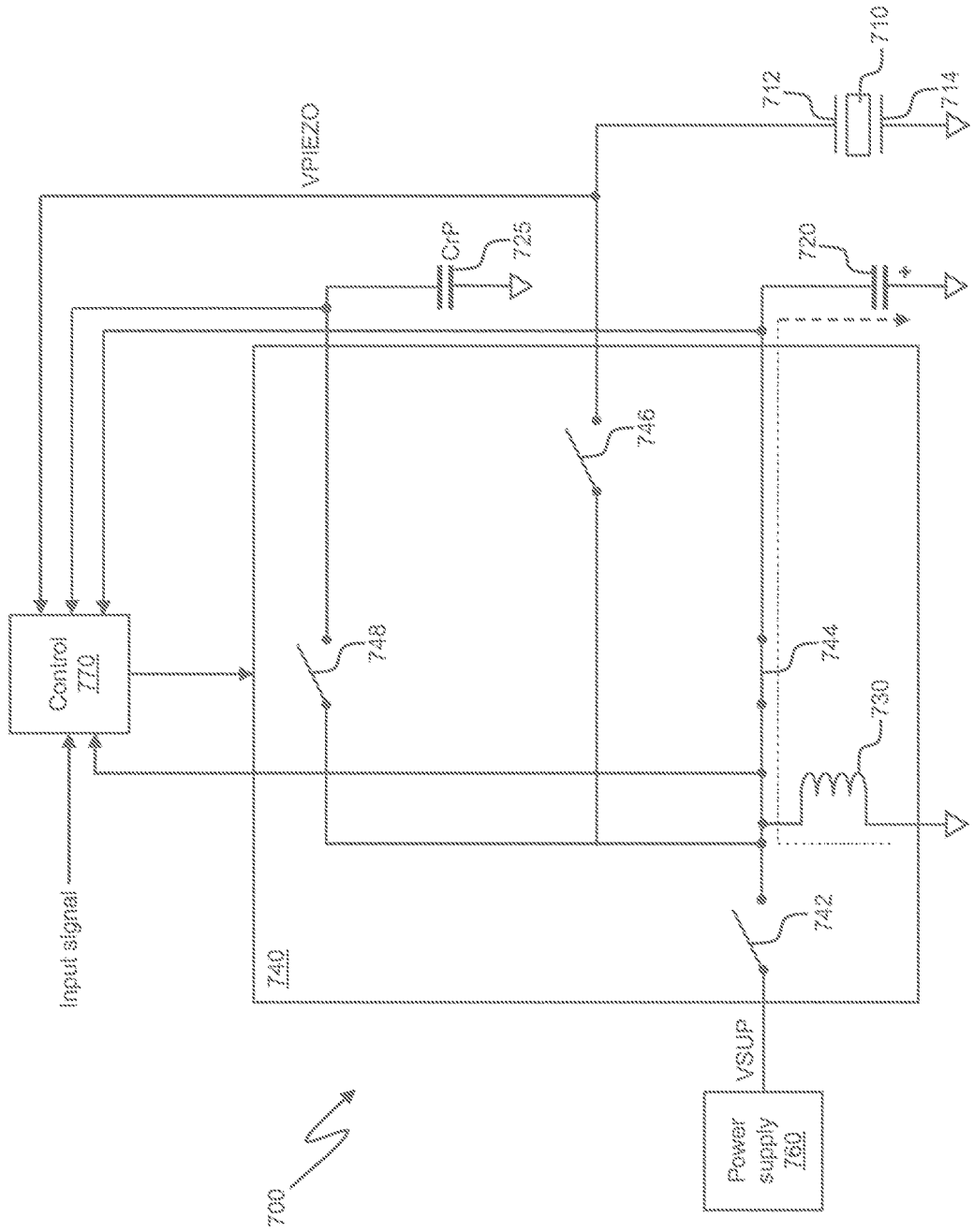
Figure 8D:
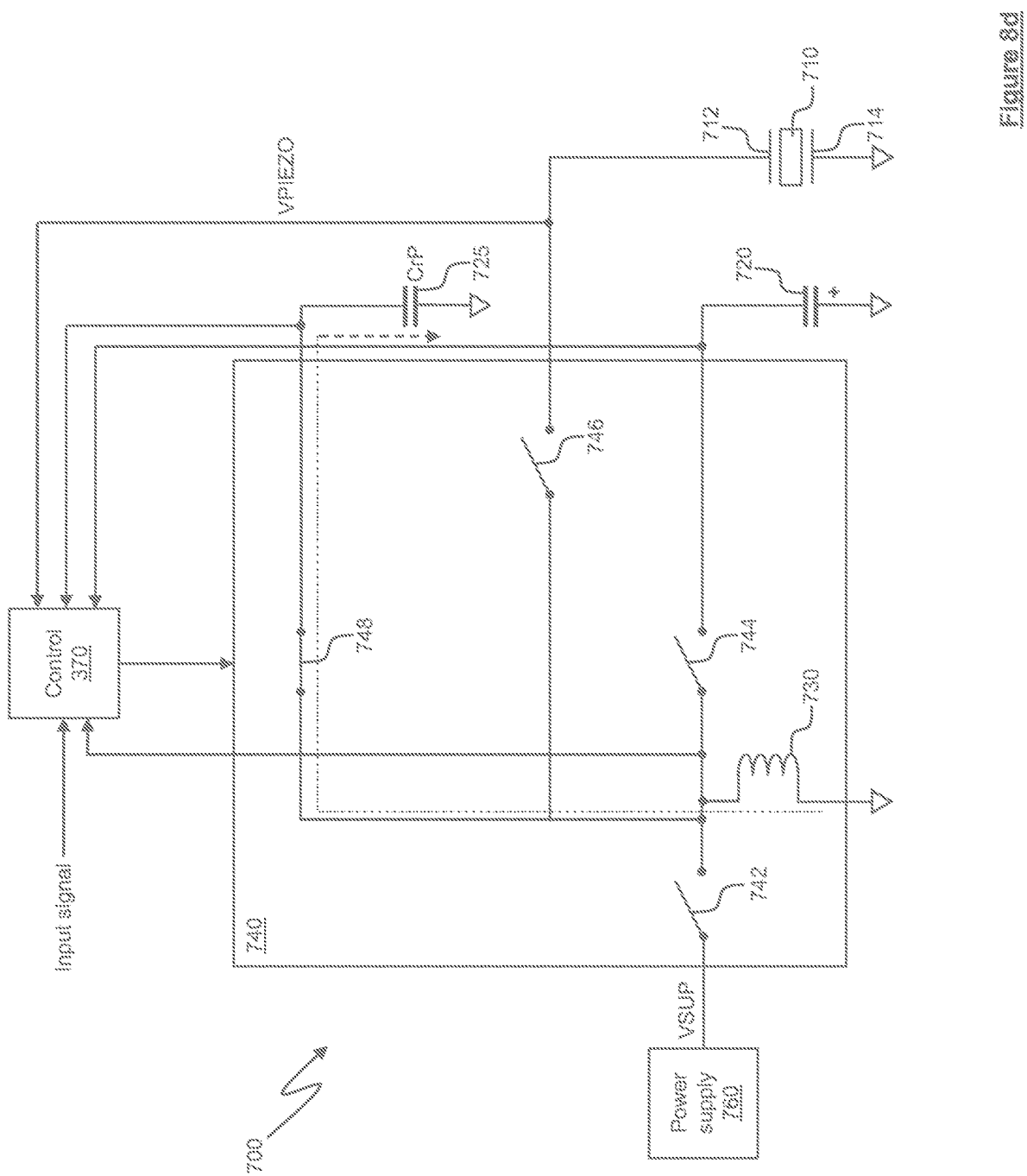

In a first phase, illustrated in FIG. 8c, the second switch 744 is closed, and the first, third and fourth switches 742, 746, 748 are open, in response to appropriate control signals from the control circuitry 770. This couples the first terminal of the first reservoir capacitor 720 to the first terminal of the inductor 730 and thus creates a current path between the first reservoir capacitor 720 and the inductor 730, as indicated by the dashed arrow in FIG. 8c.

Because the voltage across the first reservoir capacitor 720 is negative at this time, current flows from the ground/reference voltage supply rail through the inductor 730. As the current through the inductor 730, a magnetic field develops around it (as a result of the changing current through the inductor 730), storing energy. In a second phase, illustrated in FIG. 8d, the fourth switch 748 is closed, and the first, second and third switches 742, 744, 746 are open, in response to appropriate control signals from the control circuitry 770. This couples the first terminal of the second reservoir capacitor 725 to the first terminal of the inductor 730 and thus creates a current path between the second reservoir capacitor 725 and the inductor 730, as indicated by the dashed arrow in FIG. 8d.

When the second switch 742 is opened, current stops flowing from the first reservoir capacitor 720 through the inductor 730, and the magnetic field around the inductor 730 collapses. The current through the inductor 730 thus decays, which induces a positive voltage (with respect to the ground or reference voltage) across the inductor 730. Thus when the inductor 730 is switched from the first reservoir capacitor 720 to the second reservoir capacitor 725, the polarity of the voltage across the inductor 730 reverses. Because the voltage across the second reservoir capacitor 725 is equal to the ground or reference voltage at this time, current flows from the inductor 730 to the second reservoir capacitor 725 and thus a positive voltage develops across the second reservoir capacitor 725 and the second reservoir capacitor 725 becomes positively charged.

Transferring Charge from the Second Reservoir Capacitor to the First Reservoir Capacitor Charge can also be transferred from the second reservoir capacitor 725 to the first reservoir capacitor 720 using a two-phase charge transfer process, as will now be described with reference to FIGS. 8e and 8f.

At the beginning of the charge transfer process no current flows through the inductor 730 and there is a positive voltage across the second reservoir capacitor 725.

Figure 8E:
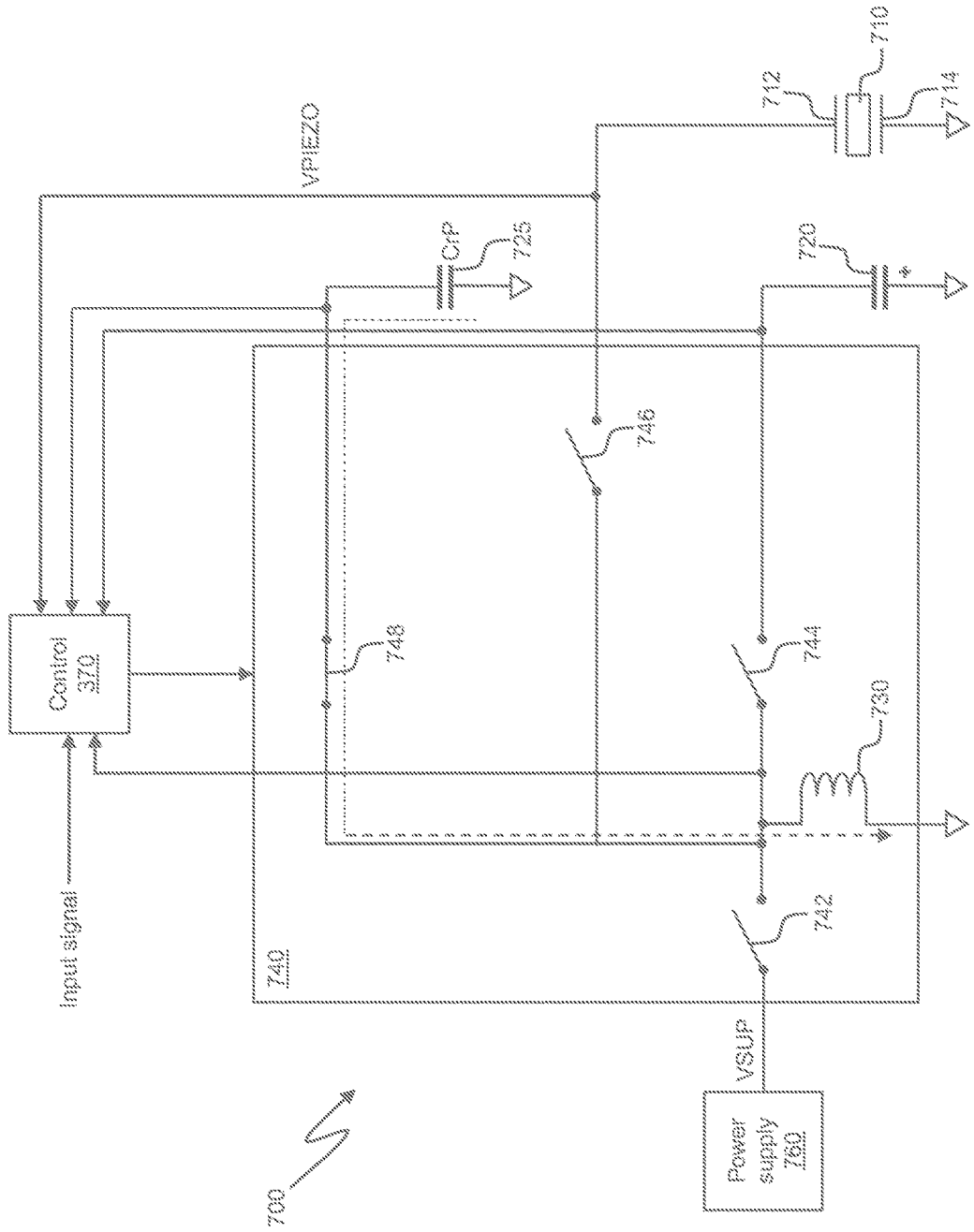

In a first phase, illustrated in FIG. 8e, the fourth switch 748 is closed, and the first, second and third switches 742, 744, 746 are open, in response to appropriate control signals from the control circuitry 770. This couples the first terminal of the second reservoir capacitor 725 to the first terminal of the inductor 730 and thus creates a current path between the second reservoir capacitor 725 and the inductor 730, as indicated by the dashed arrow in FIG. 8e.

Because the voltage across the second reservoir capacitor 725 is positive at this time, current flows from the second reservoir capacitor 725 through the inductor 730 to the ground/reference voltage supply rail. As the current through the inductor 730 increases, a magnetic field develops around it (as a result of the changing current through the inductor 730), storing energy.

Figure 8F:
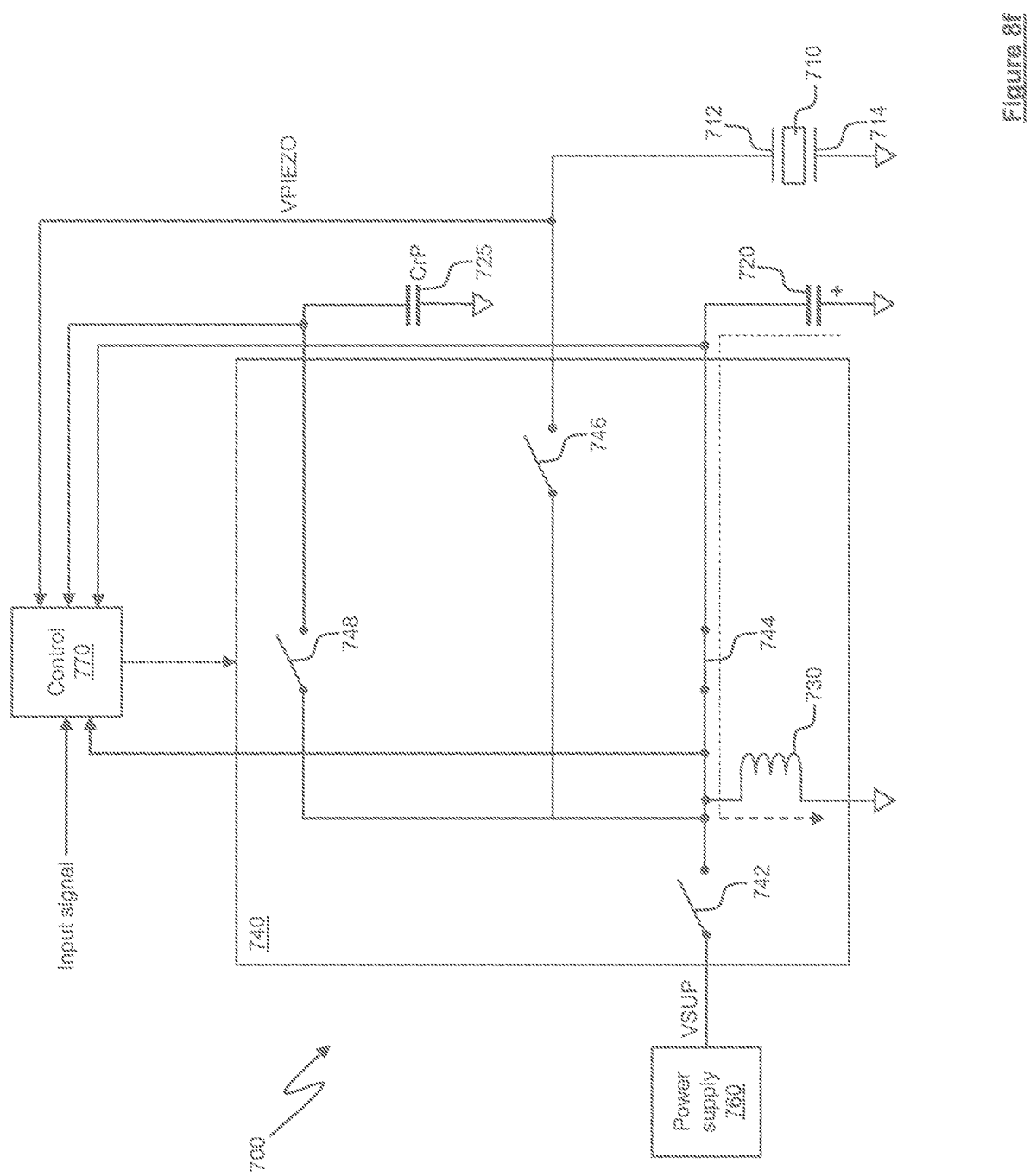
Figure 8A:
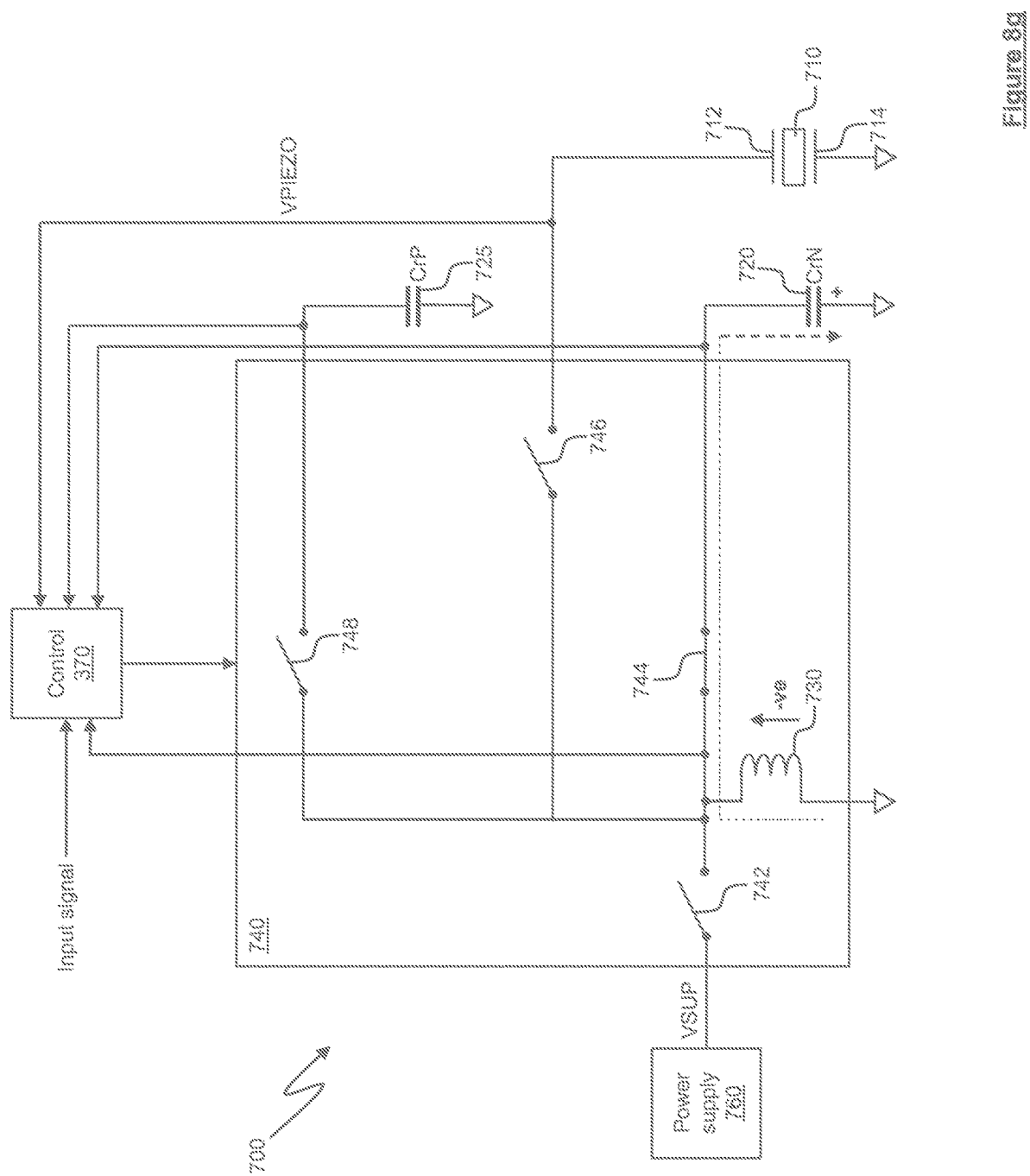

In a second phase, illustrated in FIG. 8f, the second switch 744 is closed, and the first, third and fourth switches 742, 746, 748 are open, in response to appropriate control signals from the control circuitry 770. This couples the first terminal of the first reservoir capacitor 720 to the first terminal of the inductor 730 and thus creates a current path between the first reservoir capacitor 720 and the inductor 730, as indicated by the dashed arrow in FIG. 8f.

When the fourth switch 748 is opened, current stops flowing from the power supply 760 through the inductor 730, and the magnetic field around the inductor 730 collapses. The current through the inductor 730 thus decays, which induces a negative voltage (with respect to the ground or reference voltage) across the inductor 730. Thus when the inductor 730 is switched from the second reservoir capacitor 725 to the first reservoir capacitor 720, the polarity of the voltage across the inductor 730 reverses. Because the voltage across the first reservoir capacitor 720 is equal to the ground or reference voltage at this time, current flows from first reservoir capacitor 720 through the inductor 730 to the ground/reference voltage supply rail and thus a negative voltage develops across the first reservoir capacitor 720 and the first reservoir capacitor 720 becomes negatively charged.

Transferring Charge from the First Reservoir Capacitor to the Piezoelectric Transducer When the system 700 is required to increase the level of charge on the piezoelectric transducer 710, e.g. to drive the piezoelectric transducer 710 to produce a transducer output, the system 700 again operates in two phases to perform a charge transfer process.

To supply a positive output voltage to the first terminal 712 of the piezoelectric transducer 710, charge is transferred from the first reservoir capacitor 720, as will now be described with reference to FIGS. 8g and 8h.

At the start of the charge transfer process no current flows through the inductor 730, and the first reservoir capacitor 720 is negatively charged as described above.

In a first phase of the charge transfer process, illustrated in FIG. 8g, the second switch 744 is closed and the first, third and fourth switches 742, 746, 748 are opened, in response to appropriate control signals from the control circuitry 770. This couples the first terminal of the inductor 730 to the first terminal of the first reservoir capacitor 720 and thus creates a current path from the inductor 730 to the ground/reference voltage supply through the first reservoir capacitor 720, as shown by the dashed arrow in FIG. 8g.

Because the voltage across the first reservoir capacitor 720 is negative at this time (and so a voltage across the inductor 730 is also negative due to the coupling of the inductor 730 to the first reservoir capacitor 720), current flows from the ground/reference voltage supply through the inductor 730 to the first reservoir capacitor 720. A magnetic field develops around the inductor 730 as the current through it increases.

Figure 8H:
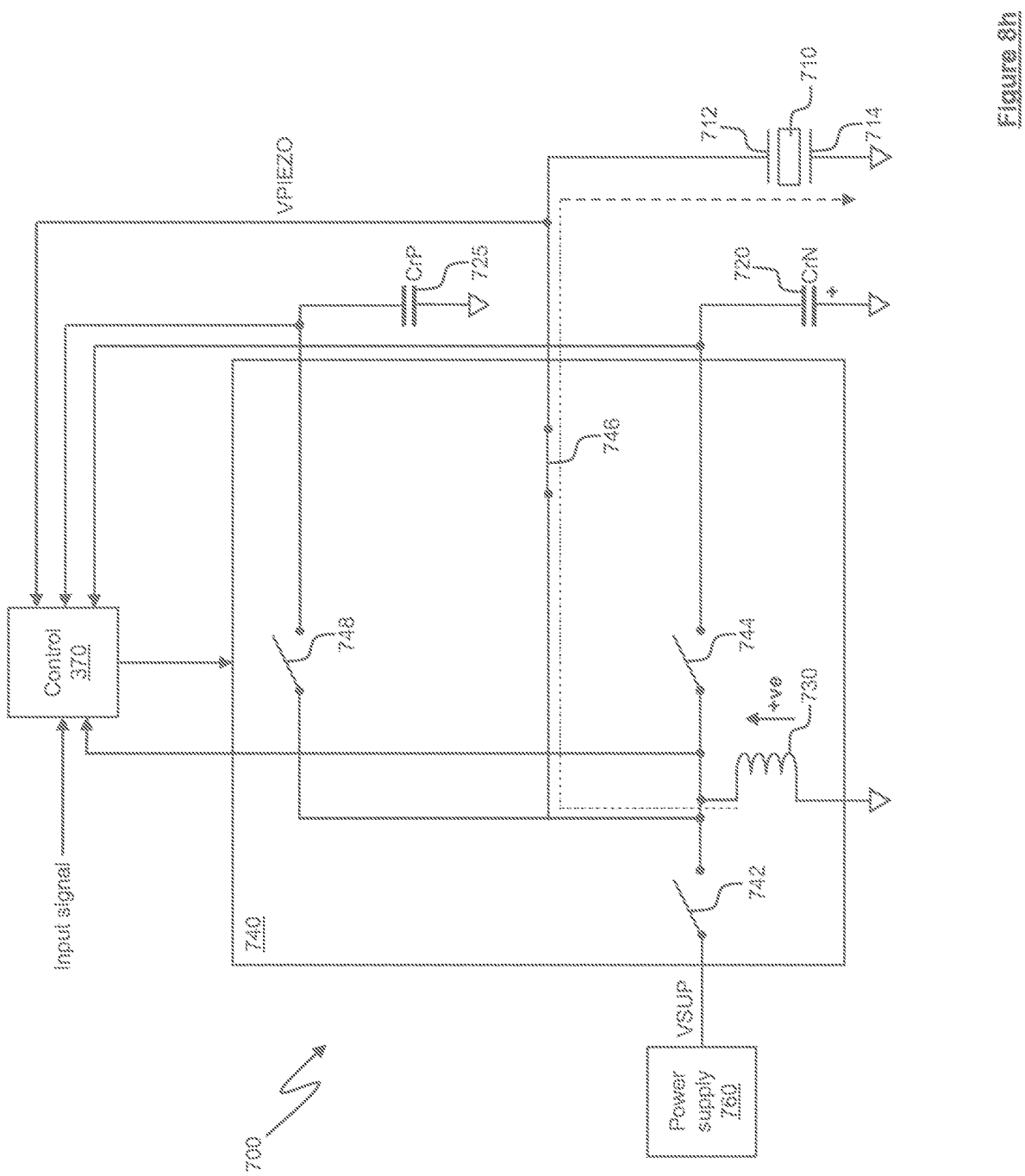

In a second phase of the charge transfer process, illustrated in FIG. 8h, the second switch 744 is opened and the third switch 746 is closed (in response to appropriate control signals from the control circuitry 770), while the first and fourth switches 742, 748 remain open. This couples the first terminal of the inductor 730 to the first terminal 712 of the piezoelectric transducer 710 and thus creates a current path from the inductor 730 to the piezoelectric transducer 710, as shown by the dashed arrow in FIG. 8h.

When the second switch 744 is opened, current stops flowing through the inductor 730 to the first reservoir capacitor 720, and the magnetic field around the inductor 730 collapses. The current through the inductor 730 thus decays, which induces a positive voltage (with respect to the ground or reference voltage) across the inductor 730. Thus when the inductor 730 is switched from the first reservoir capacitor 720 to the piezoelectric transducer 710, the polarity of the voltage across the inductor 730 reverses. Current therefore flows from the inductor 730 to the piezoelectric transducer 710.

Transferring Charge from the Second Reservoir Capacitor to the Piezoelectric Transducer To supply a negative output voltage to the first terminal 712 of the piezoelectric transducer 710, charge is transferred from the second reservoir capacitor 725, as will now be described with reference to FIGS. 8i and 8j.

At the start of the charge transfer process no current flows through the inductor 730 and the second reservoir capacitor 725 is positively charged.

Figure 8I:
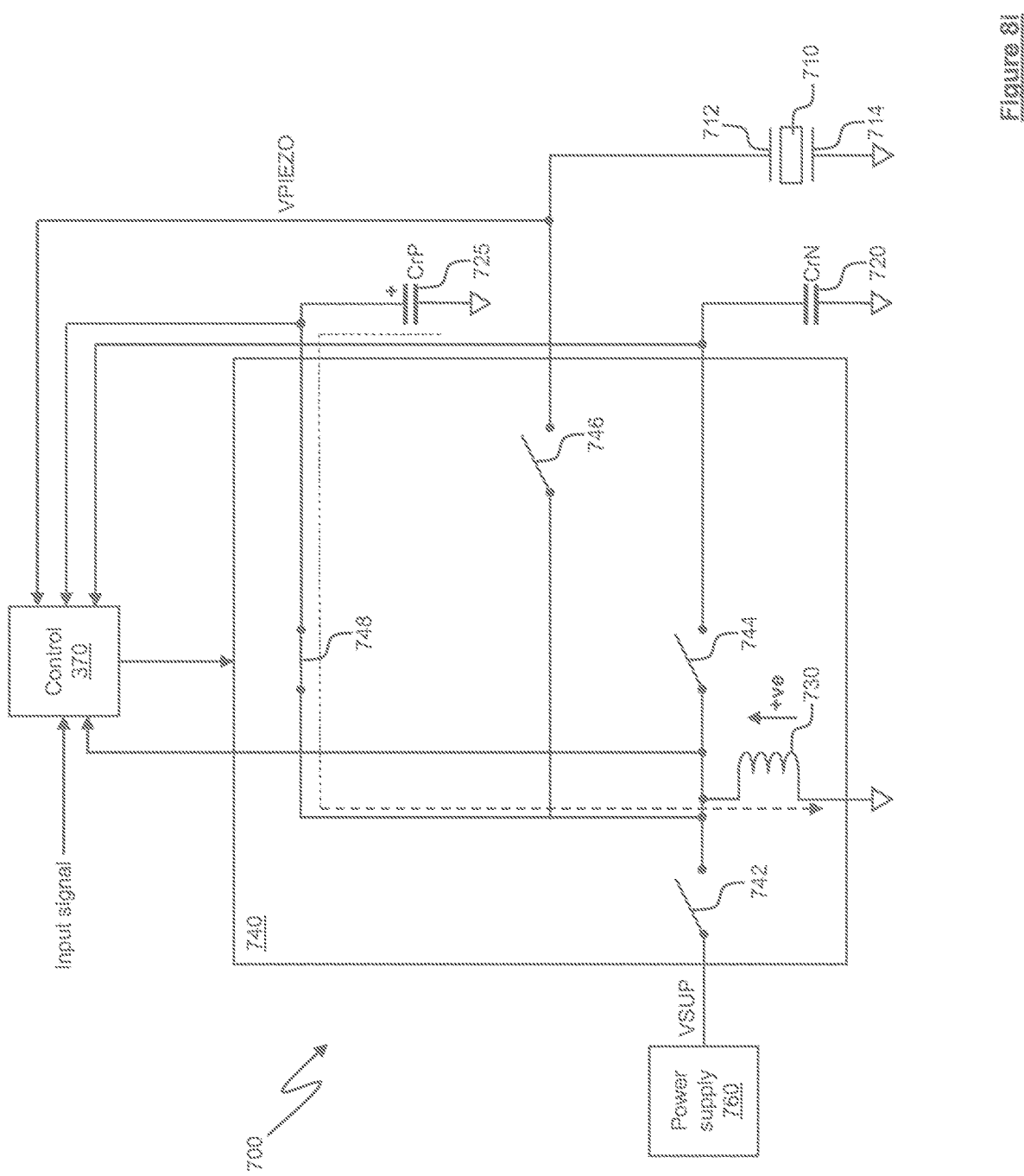
Figure 8I:
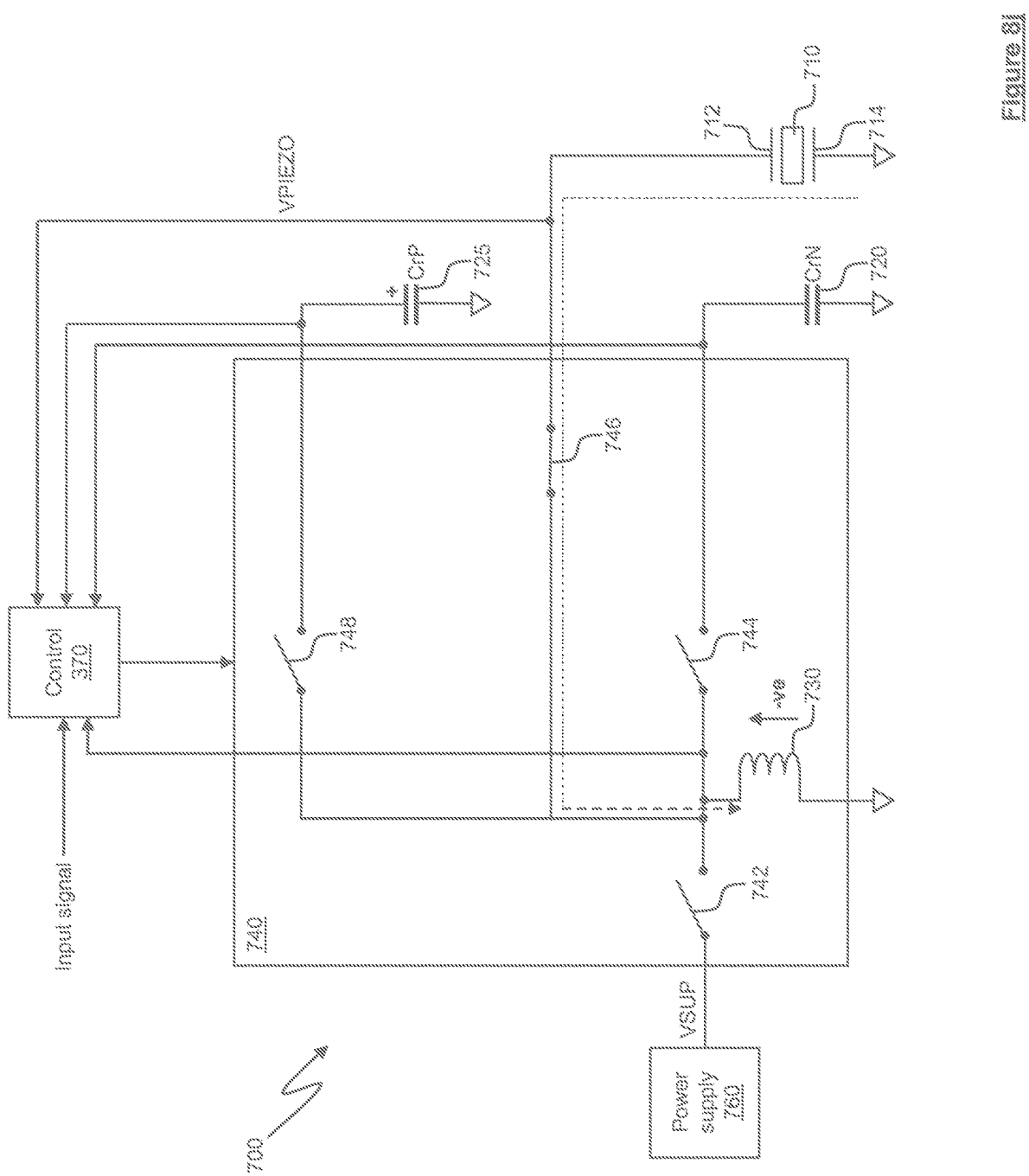

In a first phase of the charge transfer process, illustrated in FIG. 8i, the fourth switch 748 is closed and the first, second and third switches 742-746 are opened, in response to appropriate control signals from the control circuitry 770. This couples the second reservoir capacitor 725 to the first terminal of the inductor 730, and thus creates a current path from the second reservoir capacitor 725 to the ground/reference voltage supply rail, through the inductor 730, as shown by the dashed arrow in FIG. 8i.

Because the voltage across the second reservoir capacitor 725 is positive at this time (and so a voltage across the inductor 730 is also positive due to the coupling of the inductor 730 to the second reservoir capacitor 725), current flows from the second reservoir capacitor 725 through the inductor 730 to the ground/reference voltage supply. A magnetic field develops around the inductor 730 as the current through it increases.

In a second phase of the charge transfer process, illustrated in FIG. 8j, the fourth switch 748 is opened and the third switch 746 is closed (in response to appropriate control signals from the control circuitry 770), while the first and second switches 742, 744 remain open. This couples the first terminal of the inductor 730 to the first terminal 712 of the piezoelectric transducer 710 and thus creates a current path from the piezoelectric transducer 710 to the inductor 730, as shown by the dashed arrow in FIG. 8j.

When the fourth switch 748 is opened, current stops flowing from the second reservoir capacitor 725 through the inductor 730 to the ground/reference voltage supply rail, and the magnetic field around the inductor 730 collapses. The current through the inductor 730 thus decays, which induces a negative voltage (with respect to the ground or reference voltage) across the inductor 730. Thus when the inductor 730 is switched from the second reservoir capacitor 725 to the piezoelectric transducer 710, the polarity of the voltage across the inductor 730 reverses. Current therefore flows from the piezoelectric transducer 710 to the inductor 730.

Transferring Charge from the Piezoelectric Transducer to the First Reservoir Capacitor or Second Reservoir Capacitor When the system 700 is required to reduce the level of charge on the piezoelectric transducer 710, charge can be transferred from the piezoelectric transducer 710 to the first reservoir capacitor 720 when a voltage across the piezoelectric transducer 710 is positive, and charge can be transferred from the piezoelectric transducer 710 to the second reservoir capacitor 725 when the voltage across the piezoelectric transducer 710 is negative. Thus, charge remains available for future use, rather than being lost, which helps to improve the efficiency of the system 700.

Transferring Charge from the Piezoelectric Transducer to the First Reservoir Capacitor To transfer charge from the piezoelectric transducer 710 to the first reservoir capacitor 720, the system 700 again operates in two phases to perform a charge transfer process, as will be described below with reference to FIGS. 8k and 8l.

At the start of the charge transfer process no current flows through the inductor 730 and there is a positive voltage at the first terminal 712 of the piezoelectric transducer 710.

Figure 8K:
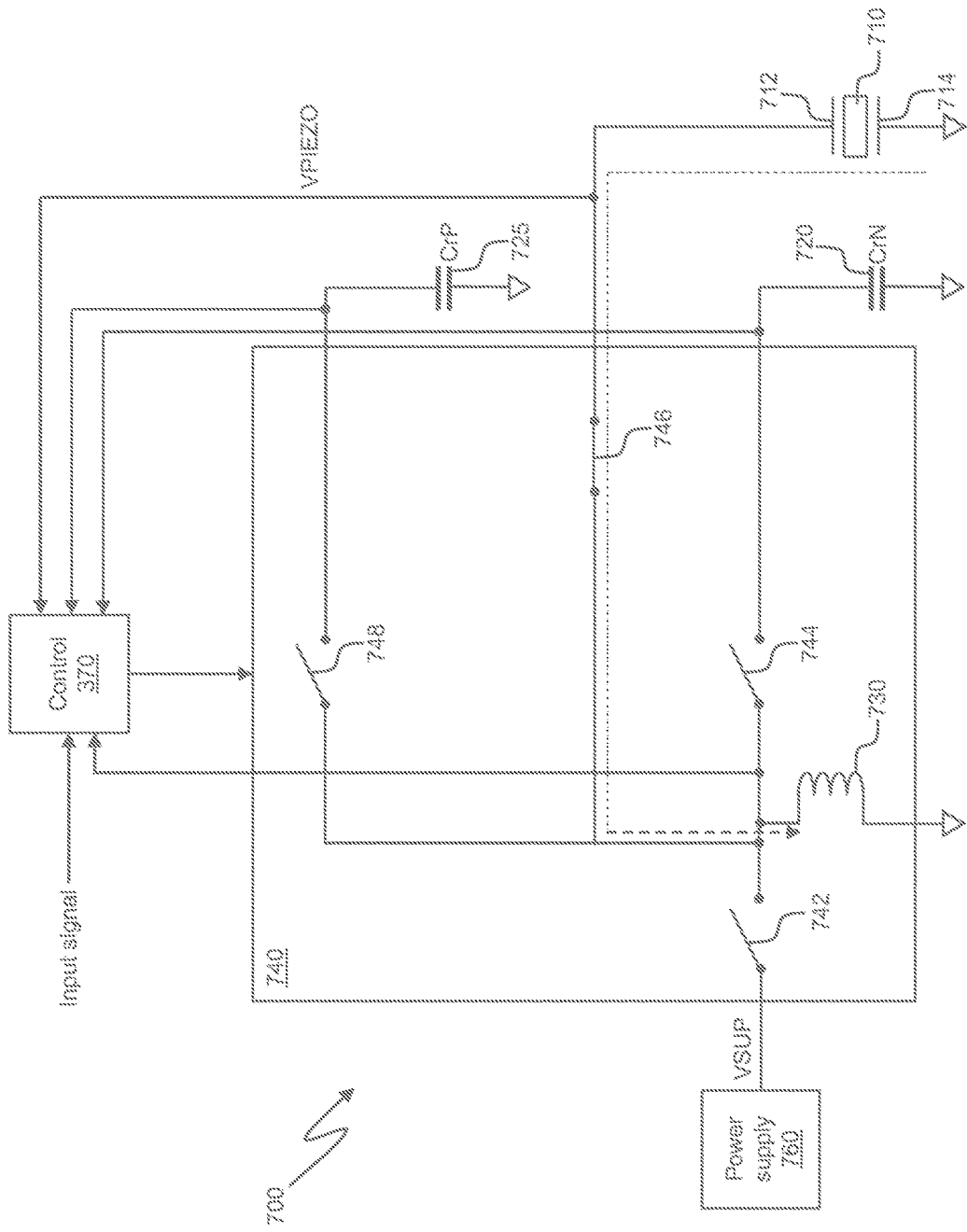
Figure 81:
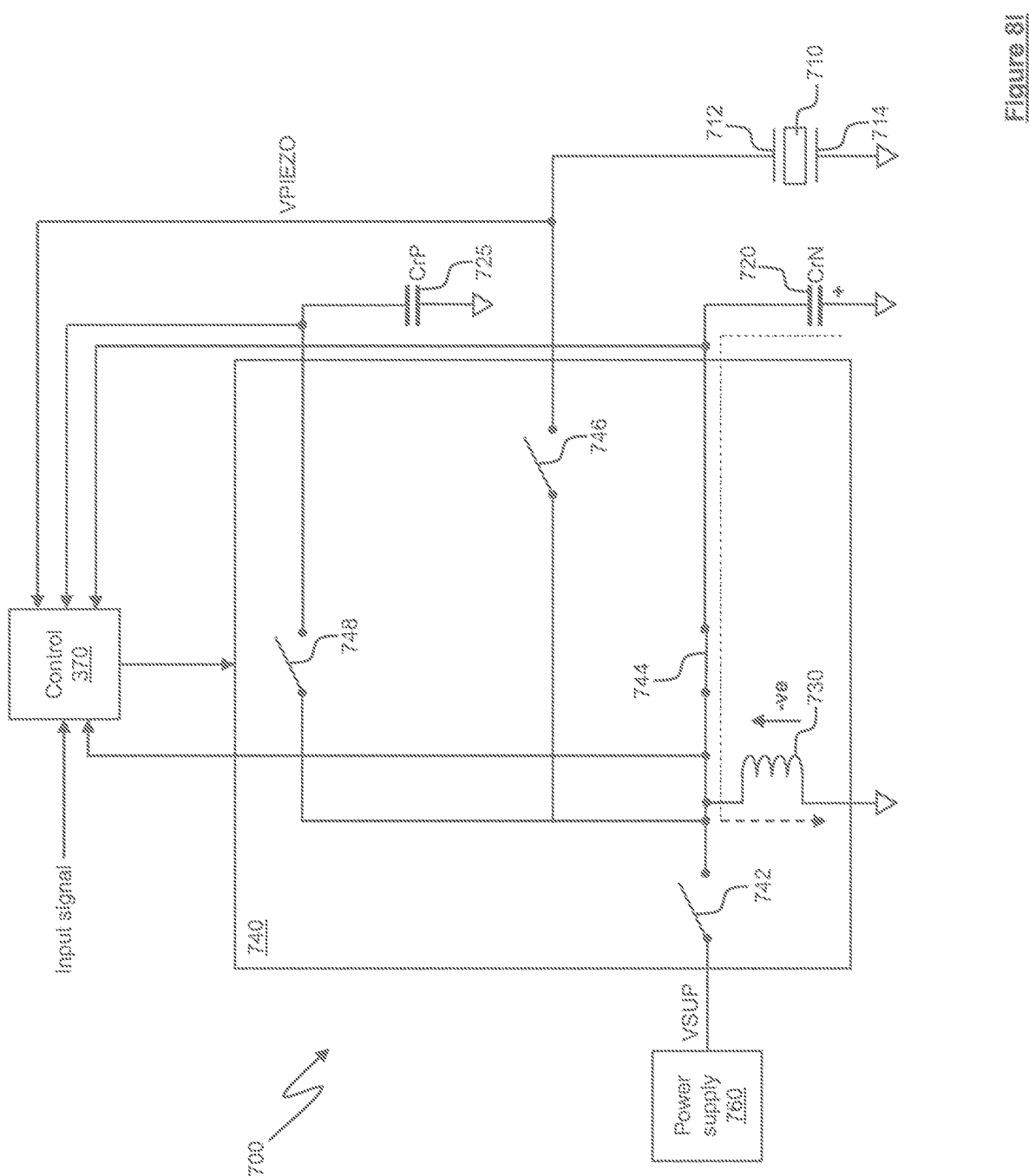

In a first phase of the charge transfer process, illustrated in FIG. 8k, the third switch 746 is closed and the first, second and fourth switches 742, 744, 748 are opened, in response to appropriate control signals from the control circuitry 770. This couples the first terminal 712 of the piezoelectric transducer 710 to the first terminal of the inductor 730, and a current path is therefore established from the piezoelectric transducer 710 through the inductor 730 to the ground/reference voltage supply, as indicated by the dashed arrow in FIG. 8k. As current flows through the inductor 730 a magnetic field develops around the inductor 730, storing energy.

In a second phase, illustrated in FIG. 8l, the third switch 746 is opened and the second switch 744 is closed, in response to appropriate control signals from the control circuitry 770. This couples the first terminal of the inductor 730 to the first reservoir capacitor 720 and thus creates a current path from the first reservoir capacitor 720, through the inductor 730 to the ground/reference voltage supply, as shown by the dashed arrow in FIG. 8l.

When the third switch 746 is opened, current stops flowing from the piezoelectric transducer 710 through the inductor 730, and the magnetic field around the inductor 730 collapses. The current through the inductor 730 thus decays, which induces a negative voltage (with respect to the ground or reference voltage) across the inductor 730. Thus when the inductor 730 is switched from the piezoelectric transducer 710 to the first reservoir capacitor 720, the polarity of the voltage across the inductor 730 reverses. Because the voltage across the first reservoir capacitor 720 is equal to the ground or reference voltage at this time, current flows from the first reservoir capacitor 720 through the inductor 730, thus negatively charging the first reservoir capacitor 720, and a negative voltage develops across the first reservoir capacitor 720.

Once the magnitude of the negative voltage that develops across the first reservoir capacitor 720 is equal to the magnitude of the negative voltage across the inductor 730, no current flows from the first reservoir capacitor 720 through the inductor 730, and the charge transfer process from the piezoelectric transducer 710 to the first reservoir capacitor 720 ends.

Transferring Charge from the Piezoelectric Transducer to the Second Reservoir Capacitor To transfer charge from the piezoelectric transducer 710 to the second reservoir capacitor 725, the system 700 again operates in two phases to perform a charge transfer process, as will be described below with reference to FIGS. 8*m* and 8*n*.

At the start of the charge transfer process no current flows through the inductor 730, and there is a negative voltage at the first terminal 712 of the piezoelectric transducer 710.

Figure 8M:
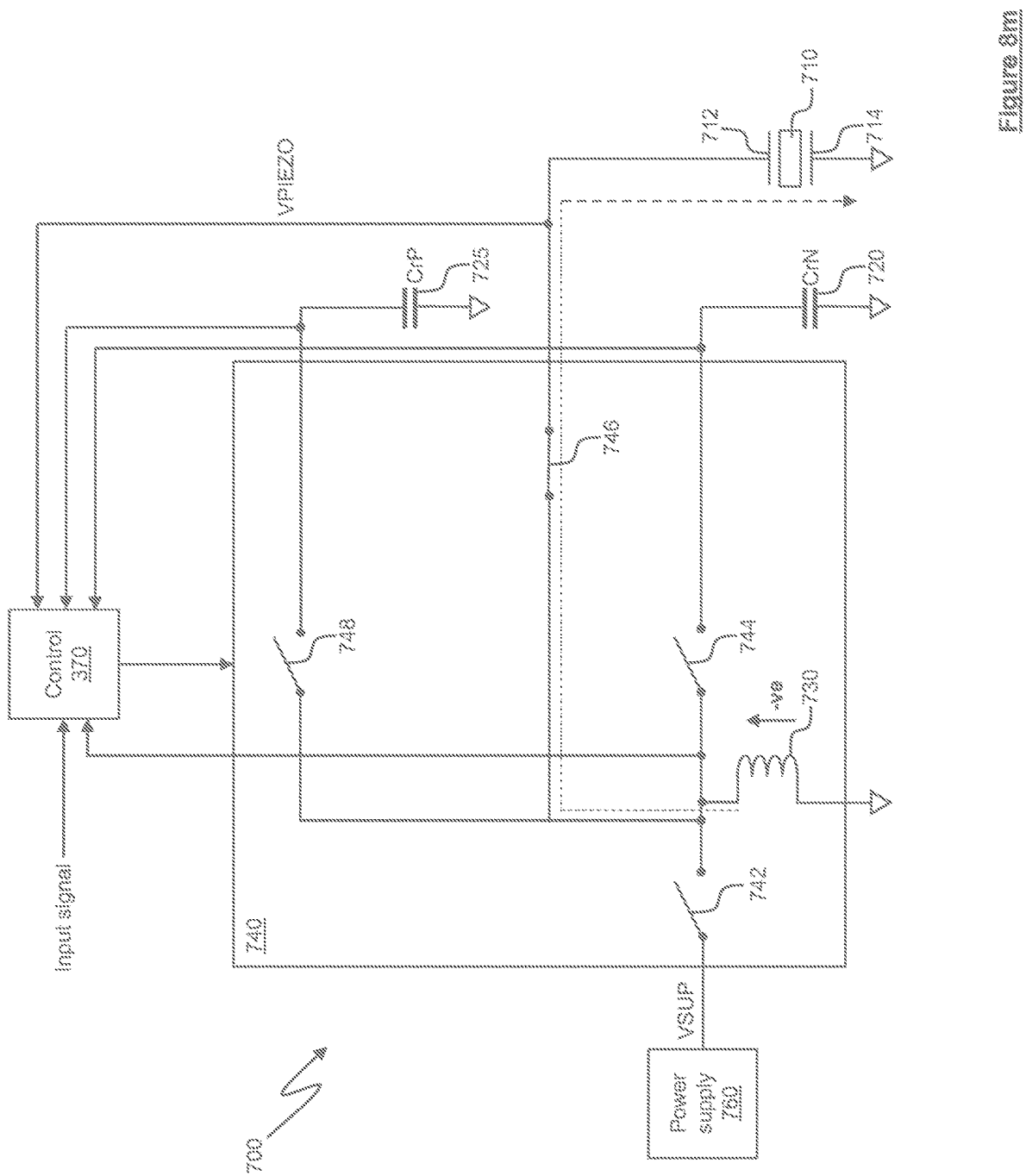

In a first phase of the charge transfer process, illustrated in FIG. 8*m*, the third switch 746 is closed and the first, second and fourth switches 742, 744, 748 are opened, in response to appropriate control signals from the control circuitry 770. This couples the first terminal of the piezoelectric transducer 712. A current path is therefore established from the ground/reference voltage supply rail through the inductor 730 to the piezoelectric transducer 710, as indicated by the dashed arrow in FIG. 8*m*. Because the voltage across the piezoelectric transducer 710 is negative, current flows from the ground/reference voltage supply rail through the inductor 730 to the piezoelectric transducer 710. As current flows through the inductor 730 a magnetic field develops around the inductor 730, storing energy.

Figure 8N:
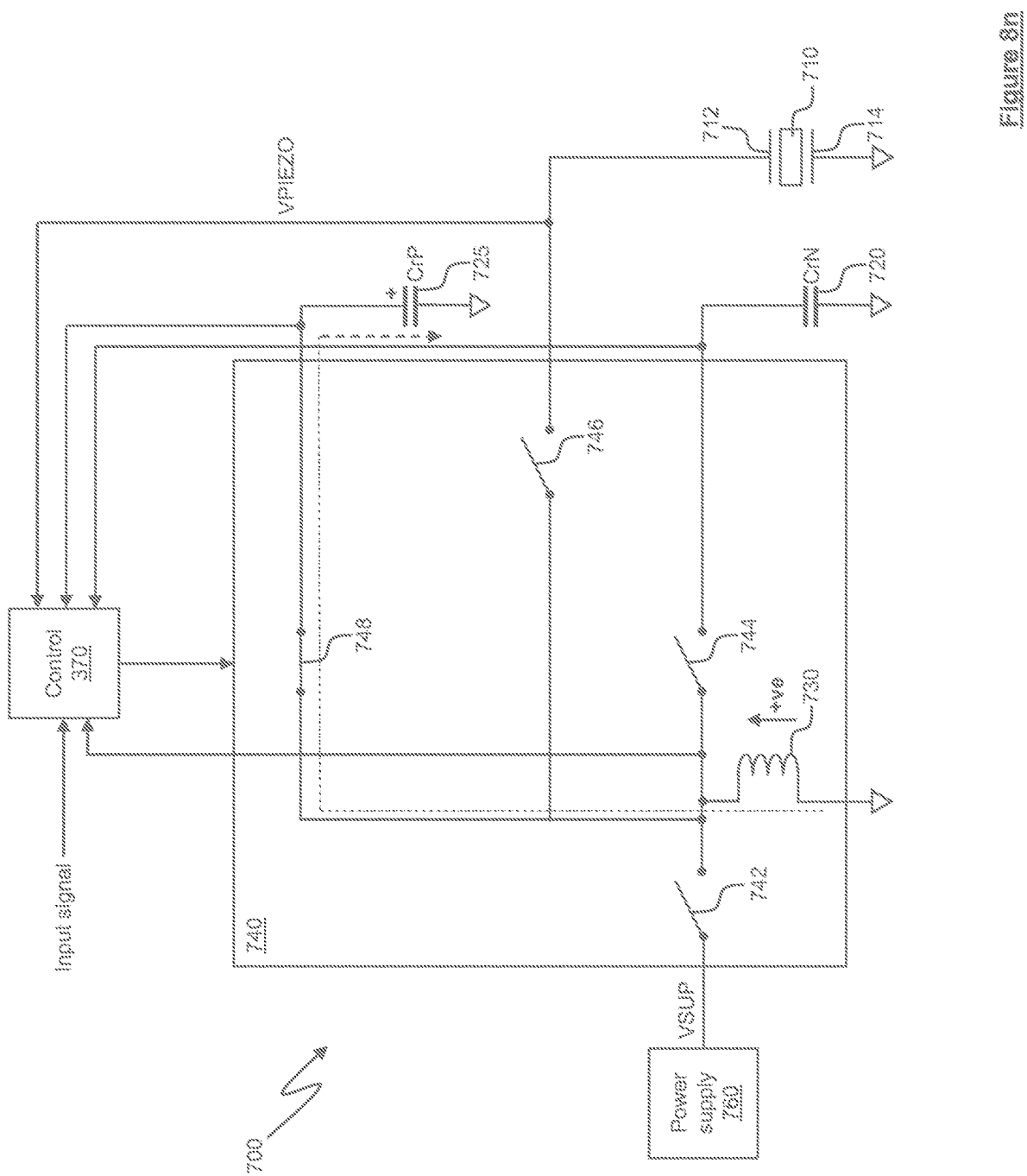

In a second phase, illustrated in FIG. 8*n*, the third switch 746 is opened and the fourth switch 748 is closed, in response to appropriate control signals from the control circuitry 770. This couples the first terminal of the inductor 730 to the first terminal of the second reservoir capacitor and thus creates a current path from the inductor 730 to the second reservoir capacitor 725, as shown by the dashed arrow in FIG. 8*n*.

When the third switch 746 is opened, current stops flowing through the inductor 730, and the magnetic field around the inductor 730 collapses. The current through the inductor 730 thus decays, which induces a positive voltage (with respect to the ground or reference voltage) across the inductor 730. Thus when the inductor 730 is switched from the piezoelectric transducer 710 to the second reservoir capacitor 725, the polarity of the voltage across the inductor 730 reverses. Because the voltage across the second reservoir capacitor 725 is equal to the ground or reference voltage at this time, current flows from the inductor 730 to the second reservoir capacitor 725, and thus a positive voltage develops across the second reservoir capacitor 725 and the second reservoir capacitor 725 becomes positively charged.

Once the magnitude of the positive voltage that develops across the second reservoir capacitor 725 is equal to the magnitude of the positive voltage across the inductor 730, no current flows from the inductor 730 to the second reservoir capacitor 725, and the charge transfer process from the piezoelectric transducer 710 to the second reservoir capacitor 725 ends.

Thus in the system 700 the piezoelectric transducer 710 can be driven by transferring charge to it from the reservoir capacitors 720, 725, and charge can be recycled between the piezoelectric transducer 710 and the reservoir capacitors 720, 725 to improve power efficiency. The power supply 760 provides the initial charge to one or both of the reservoir capacitors 720, 725 during the charging process and occasionally or periodically tops up or recharges one or both of the reservoir capacitors 720, 725 as necessary.

As will be appreciated from the foregoing description, the current through the inductor 730 at the end of each process (i.e. charging, charge transfer to the piezoelectric transducer 710 and charge transfer from the piezoelectric transducer 710) is zero, and thus the system 700 is configured to operate in a discontinuous mode. Because the polarity of the voltage across the inductor 730 is reversed or inverted when the inductor 730 is switched in each phase, the system 700 can be said to constitute inverting charge transfer circuitry. Further, as the first terminal 712 of the piezoelectric transducer 710 can receive a drive signal of two different polarities (positive or negative), the system 700 can be said to be bipolar. Thus, the system 700 provides bipolar inverting drive circuitry that is operative in a discontinuous mode to transfer charge to the piezoelectric transducer 710.

The system 700, or part of the system 700, may be implemented in integrated circuitry e.g. as a single integrated circuit (IC). Thus in some examples the switch network 740 may be implemented in integrated circuitry, while the inductor 730 and/or the reservoir capacitors 720, 725 may be provided as discrete, off-chip components coupled to the switch network via pins, pads, ball or other connections of the integrated circuitry. In other examples the inductor 730 may be an embedded inductor integrated within the integrated circuit. The control circuitry 770 may be integrated into the same IC as the switch network 740, or may be provided in or as part of a separate IC.

Alternatively the system may be implemented using discrete circuitry, e.g. as discrete components mounted on a printed circuit board or other suitable substrate.

As will be appreciated by those of ordinary skill in the art, the third switch 746 of the system 700 should be capable of conducting current in two opposite directions and of sustaining a high breakdown voltage. To this end, in a practical implementation of the system 700, the third switch 746 may be implemented using an arrangement of the kind shown generally at 500 in FIG. 5.

The drive circuitry of the systems 300, 700 described above provides means for driving a piezoelectric transducer with charge, thereby mitigating the problems associated of creep and hysteresis associated with voltage-drive systems. As will be apparent from the discussion above, charge can be recirculated or recycled to improve efficiency. Moreover, the systems 300, 700 employ fewer switches (even in the bipolar system 700) than the system 200 described above with reference to FIG. 2, which reduces switching losses.

Embodiments may be implemented as an integrated circuit which in some examples could be a codec or audio DSP or similar. Embodiments may be incorporated in an electronic device, which may for example be a portable device and/or a device operable with battery power. The device could be a communication device such as a mobile telephone or smartphone or similar. The device could be a computing device such as a notebook, laptop or tablet computing device. The device could be a wearable device such as a smartwatch. The device could be a device with voice control or activation functionality such as a smart speaker. In some instances the device could be an accessory device such as a headset, headphones, earphones, earbuds or the like to be used with some other product.

The skilled person will recognise that some aspects of the above-described apparatus and methods, for example the discovery and configuration methods may be embodied as processor control code, for example on a non-volatile carrier medium such as a disk, CD- or DVD-ROM, programmed memory such as read only memory (Firmware), or on a data carrier such as an optical or electrical signal carrier. For many applications, embodiments will be implemented on a DSP (Digital Signal Processor), ASIC (Application Specific Integrated Circuit) or FPGA (Field Programmable Gate Array). Thus the code may comprise conventional program code or microcode or, for example code for setting up or controlling an ASIC or FPGA. The code may also comprise code for dynamically configuring re-configurable apparatus such as re-programmable logic gate arrays. Similarly the code may comprise code for a hardware description language such as Verilog™ or VHDL (Very high speed integrated circuit Hardware Description Language). As the skilled person will appreciate, the code may be distributed between a plurality of coupled components in communication with one another. Where appropriate, the embodiments may also be implemented using code running on a field-(re) programmable analogue array or similar device in order to configure analogue hardware.

It should be noted that the above-mentioned embodiments illustrate rather than limit the invention, and that those skilled in the art will be able to design many alternative embodiments without departing from the scope of the appended claims. The word "comprising" does not exclude the presence of elements or steps other than those listed in a claim, "a" or "an" does not exclude a plurality, and a single feature or other unit may fulfil the functions of several units recited in the claims. Any reference numerals or labels in the claims shall not be construed so as to limit their scope.

The invention claimed is:

1. Drive circuitry for driving a piezoelectric transducer, the drive circuitry comprising:
an input for receiving an input signal indicative of a desired output of the piezoelectric transducer;
an inductor;
a first reservoir capacitor;
a switch network; and
control circuitry configured to control operation of the switch network to selectively couple the inductor to one of a power supply, the first reservoir capacitor and the piezoelectric transducer,
wherein the circuitry is configured in a discontinuous mode to transfer charge between the first reservoir capacitor and the piezoelectric transducer to drive the piezoelectric transducer to produce an output based on the input signal,
and wherein a polarity of the first reservoir capacitor is opposite to a polarity of the power supply.

2. Drive circuitry according to claim 1, wherein the switch network comprises first, second and third switches, wherein:
the first switch is configured to selectively couple the inductor to a power supply;
the second switch is configured to selectively couple the inductor to the first reservoir capacitor; and
the third switch is configured to selectively couple the inductor to the piezoelectric transducer.

3. Drive circuitry according to claim 1, wherein the control circuitry is configured to control operation of switch network according to an input signal.

4. Drive circuitry according to claim 1, wherein the circuitry is configured for unipolar drive of the piezoelectric transducer.

5. Drive circuitry according to claim 1, wherein the circuitry is configured for bipolar drive of the piezoelectric transducer.

6. Drive circuitry according to claim 5, wherein the circuitry further comprises commutator circuitry coupled to the switch network, the commutator circuitry being configured to selectively couple a first or a second terminal of the piezoelectric transducer to an output of the switch network.

7. Drive circuitry according to claim 5, wherein the circuitry further comprises a second reservoir capacitor, wherein a polarity of the second reservoir capacitor is opposite to a polarity of the first reservoir capacitor, and wherein the control circuitry is configured to control operation of the switch network to selectively couple the inductor to one of a power supply, the first reservoir capacitor, the second reservoir capacitor and the piezoelectric transducer.

8. Drive circuitry according to claim 7, wherein the switch network comprises first, second, third and fourth switches, wherein:
the first switch is configured to selectively couple the inductor to a power supply;
the second switch is configured to selectively couple the inductor to the first reservoir capacitor;
the third switch is configured to selectively couple the inductor to the piezoelectric transducer; and
the fourth switch is configured to selectively couple the inductor to the second reservoir capacitor.

9. Drive circuitry according to claim 1, wherein the inductor comprises a first terminal and a second terminal, wherein the second terminal is coupled to a ground or reference voltage supply of the circuitry.

10. Drive circuitry according to claim 2, wherein the circuitry is configured to perform a charging process to charge the first reservoir capacitor, wherein:
in a first phase of the charging process, the first switch couples the inductor to the power supply and the second switch decouples the inductor from the first reservoir capacitor; and
in a second phase of the charging process, the first switch decouples the inductor from the power supply and the second switch couples the inductor to the first reservoir capacitor.

11. Drive circuitry according to claim 2, wherein the circuitry is configured to perform a first charge transfer process to transfer charge from the first reservoir capacitor to the piezoelectric transducer, wherein:
in a first phase of the first charge transfer process, the second switch couples the inductor to the first reservoir capacitor and the third switch decouples the inductor from the piezoelectric transducer; and
in a second phase of the first charge transfer process, the second switch decouples the inductor from the first reservoir capacitor and the third switch couples the inductor to the piezoelectric transducer.

12. Drive circuitry according to claim 2, wherein the circuitry is configured to perform a second charge transfer process to transfer charge from the piezoelectric transducer to the first reservoir capacitor, wherein:
in a first phase of the second charge transfer process, the second switch decouples the inductor from the first reservoir capacitor and the third switch couples the inductor to the piezoelectric transducer; and
in a second phase of the second charge transfer process, the second switch couples the inductor to the first reservoir capacitor and the third switch decouples the inductor from the piezoelectric transducer.

13. Drive circuitry according to claim 8, wherein the circuitry is configured to perform a third charge transfer process to transfer charge from the second reservoir capacitor to the piezoelectric transducer, wherein:
- in a first phase of the third charge transfer process, the fourth switch couples the inductor to the second reservoir capacitor and the third switch decouples the inductor from the piezoelectric transducer; and
- in a second phase of the third charge transfer process, the fourth switch decouples the inductor from the second reservoir capacitor and the third switch couples the inductor to the piezoelectric transducer.

14. Drive circuitry according to claim 8, wherein the circuitry is configured to perform a fourth charge transfer process to transfer charge from the piezoelectric transducer to the second reservoir capacitor, wherein:
- in a first phase of the fourth charge transfer process, the fourth switch decouples the inductor from the second reservoir capacitor and the third switch couples the inductor to the piezoelectric transducer; and
- in a second phase of the fourth charge transfer process, the fourth switch couples the inductor to the second reservoir capacitor and the third switch decouples the inductor from the piezoelectric transducer.

15. Drive circuitry according to claim 8, wherein the circuitry is configured to perform a fifth charge transfer process to transfer charge from the first reservoir capacitor to the second reservoir capacitor, wherein:
- in a first phase of the fifth charge transfer process, the second switch couples the inductor to the first reservoir capacitor and the fourth switch decouples the inductor from the second reservoir capacitor; and
- in a second phase of the fifth charge transfer process, the fourth switch couples the inductor to the second reservoir capacitor and the second switch decouples the inductor from the first reservoir capacitor.

16. Drive circuitry according to claim 8, wherein the circuitry is configured to perform a sixth charge transfer process to transfer charge from the second reservoir capacitor to the first reservoir capacitor, wherein:
- in a first phase of the sixth charge transfer process, the second switch decouples the inductor from the first reservoir capacitor and the fourth switch couples the inductor to the second reservoir capacitor; and
- in a second phase of the sixth charge transfer process, the fourth switch decouples the inductor from the second reservoir capacitor and the second switch couples the inductor to the first reservoir capacitor.

17. An integrated circuit comprising the circuitry of claim 1.

18. An integrated circuit according to claim 17 wherein the inductor is integrated within the integrated circuit.

19. A device comprising the circuitry of claim 1, wherein the device comprises a mobile telephone, a tablet or laptop computer, a gaming device, an accessory device, a headset, headphones, earphones, or a smart speaker.

20. Circuitry for driving a piezoelectric transducer, the circuitry comprising:
- an input for receiving an input signal indicative of a desired output of the piezoelectric transducer;
- an inductor having a first terminal and a second terminal, wherein the second terminal is coupled to a ground or reference voltage supply of the circuitry;
- a first reservoir capacitor;
- a switch network; and
- control circuitry configured to control operation of the switch network so as to switch the first terminal of the inductor between the first reservoir capacitor and the piezoelectric transducer, such that a polarity of a voltage across the inductor reverses each time the first terminal of the inductor is switched,
- wherein the control circuitry is configured to control operation of the switch network to transfer charge between the first reservoir capacitor and the piezoelectric transducer to drive the piezoelectric transducer to produce an output based on the input signal.

* * * * *